(12) United States Patent
Hori et al.

(10) Patent No.: US 10,305,709 B2
(45) Date of Patent: May 28, 2019

(54) DEVICE AND METHOD FOR SKEW COMPENSATION BETWEEN DATA SIGNAL AND CLOCK SIGNAL

(71) Applicant: Synaptics Japan GK, Tokyo (JP)

(72) Inventors: Yoshihiko Hori, Tokyo (JP); Takefumi Seno, Tokyo (JP); Keiichi Itoigawa, Tokyo (JP); Jun Kurosawa, Tokyo (JP); Takashi Tamura, Tokyo (JP); Hideaki Kuwada, Tokyo (JP); Kazuhiko Kanda, Tokyo (JP); Tomoo Minaki, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days.

(21) Appl. No.: 15/679,917

(22) Filed: Aug. 17, 2017

(65) Prior Publication Data

US 2018/0054336 A1 Feb. 22, 2018

(30) Foreign Application Priority Data

Aug. 18, 2016 (JP) ................. 2016-160382

(51) Int. Cl.
| | |
|---|---|
| *H03K 9/00* | (2006.01) |
| *H04L 25/14* | (2006.01) |
| *H04L 7/00* | (2006.01) |
| *H03L 7/081* | (2006.01) |
| *H04L 7/033* | (2006.01) |
| *H04L 7/04* | (2006.01) |

(52) U.S. Cl.
CPC ............ *H04L 25/14* (2013.01); *H03L 7/0812* (2013.01); *H04L 7/0004* (2013.01); *H04L 7/0008* (2013.01); *H04L 7/0037* (2013.01); *H04L 7/0041* (2013.01); *H04L 7/0337* (2013.01); *H04L 7/0338* (2013.01); *H04L 7/04* (2013.01)

(58) Field of Classification Search
CPC ..... H04L 25/14; H04L 7/0037; H04L 7/0008; H04L 7/0041; H04L 7/04; H04L 7/0338
USPC ....... 375/316, 233, 355, 371, 295, 362, 375, 375/376, 308; 327/34, 158, 277
See application file for complete search history.

(56) References Cited

U.S. PATENT DOCUMENTS

| | | | |
|---|---|---|---|
| 7,242,221 B1 * | 7/2007 | Hoang ........... | H03K 19/017581 326/38 |
| 9,020,085 B1 * | 4/2015 | Gagnon ................... | H03L 7/00 375/355 |
| 2003/0011580 A1 * | 1/2003 | Choi ....................... | G09G 5/18 345/204 |

(Continued)

*Primary Examiner* — Dhaval V Patel
(74) *Attorney, Agent, or Firm* — Patterson + Sheridan, LLP

(57) ABSTRACT

A semiconductor device includes first and second buffers respectively outputting reception data and clock signals; a latch circuit latching the reception data signal in response to the reception clock signal; a delay circuitry delaying the reception clock signal by a set delay time; and a delay control circuitry which searches a first delay time while increasing the set delay time from an initial value; searches a second delay time while increasing the set delay time from the first delay time; searches a third delay time while decreasing the set delay time from the second delay time; and determines an optimum delay time from the first and third delay times. The first and third delay times are determined so that the reception data is stabilized to a first value and the second delay time is determined so that the reception data is stabilized to a second value.

20 Claims, 31 Drawing Sheets

(56) References Cited

U.S. PATENT DOCUMENTS

2011/0255867 A1* 10/2011 Fan ..................... H03K 5/135
                                                         398/45
2014/0241465 A1*  8/2014 Itoigawa ............ H04L 25/0272
                                                         375/316

* cited by examiner

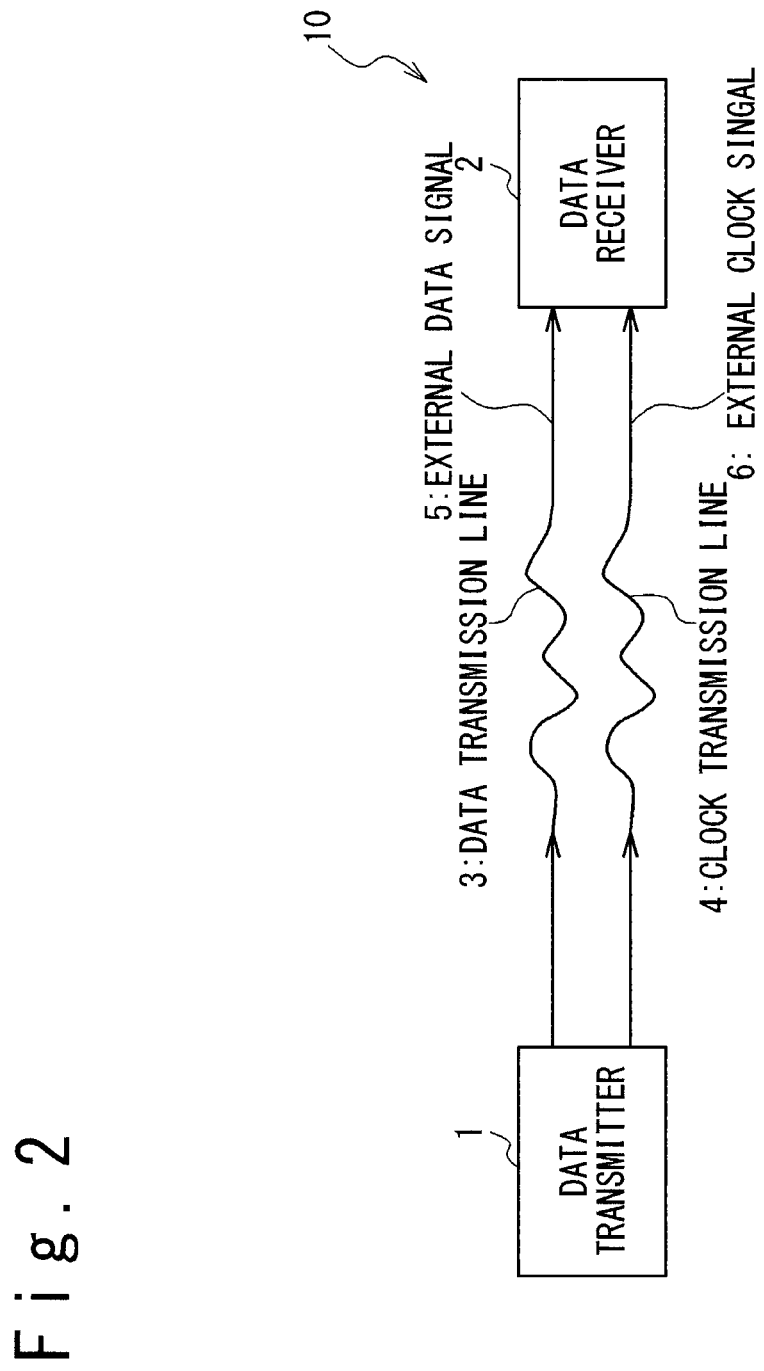

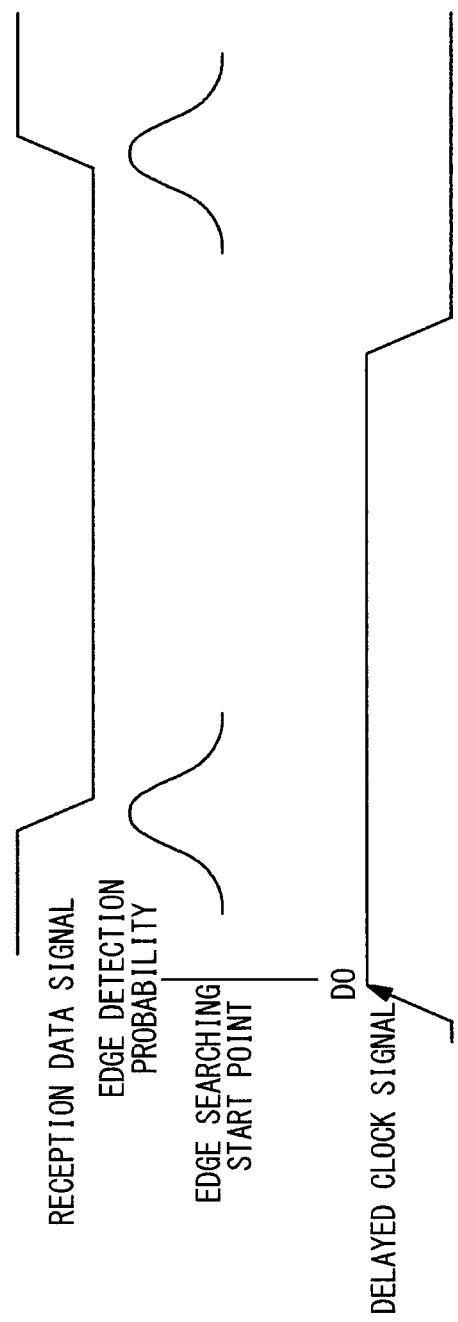

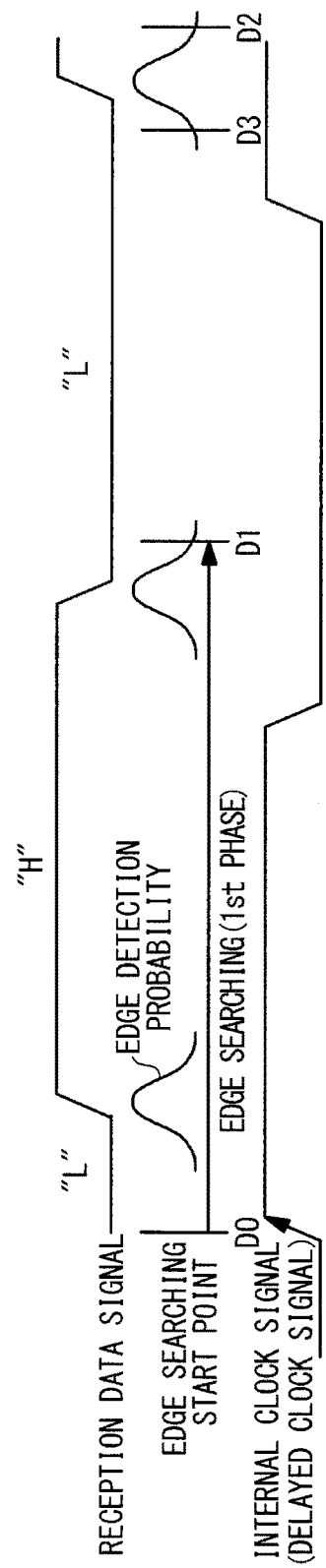

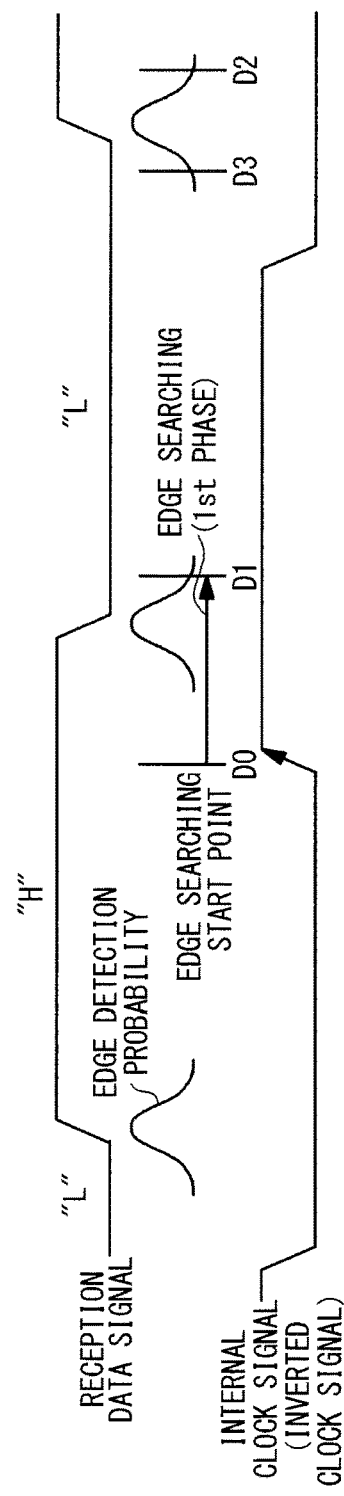

DEVICE AND METHOD FOR SKEW COMPENSATION BETWEEN DATA SIGNAL AND CLOCK SIGNAL

CROSS REFERENCE

This application claims priority to Japanese Patent Application No. 2016-160382, filed on Aug. 18, 2016, the disclosure of which is incorporated herein by reference in its entirety.

TECHNICAL FIELD

The present disclosure relates to a semiconductor device, a data transfer system and a method of operating a semiconductor device, more particularly, to a data interface for transmitting data to a semiconductor device.

BACKGROUND ART

Recent semiconductor devices require data transfer at increasingly higher speed. For example, due to an increase in the display resolution of portable terminals, the data transmission rate of image data to a display driver which drives a display panel (e.g., a liquid crystal display (LCD) panel, an organic light emitting diode (OLED) panel, and so forth) has been increasingly increased.

One technique commonly used in high-speed data transmission is clock embedding, which involves embedding a clock in a data signal; however, clock embedding requires circuits which consume relatively large electric power, such as PLL (phase locked loop) circuits and DLL (delay locked loop) circuits.

From this background, a battery-powered appliance, such as a portable terminal, often uses an architecture in which a data signal and a clock signal are transmitted over separate transmission lines, without using clock embedding. For example, the Mobile Industry Processor Interface (MIPI) D-PHY specification, which has been standardized by the MIPI Alliance, uses an architecture in which a data signal and a clock signal are transmitted over separate transmission lines.

In a data transmission system using such an architecture, the phases of the data signal and the clock signal are designed to provide a sufficient margin for the setup time and hold time, which are determined by the design of the receiving side.

FIG. 1A illustrates an example of the phases of a data signal and a clock signal. Data transfer is considered stable when the sum of the setup time and the hold time is sufficiently short with respect to a UI (unit interval), which is the unit time of the data transfer. The time difference $t_{UI} - (t_{SETUP} + t_{HOLD})$ is the time margin acceptable in the design, where $t_{UI}$ is the time duration of one UI, $t_{SETUP}$ is the setup time and $t_{HOLD}$ is the hold time. FIG. 1A illustrates the case when the sum of the setup time and the hold time is sufficiently short for one UI.

A part of the time margin may be allocated to compensation of design variations in the transmitting-side device and the receiving-side device; however when data transfer is performed at a high data rate in a data transfer system in which a data signal and a clock signal are transmitted over separate transmission lines, a major part of the time margin is used to acquire a design margin of the transmission lines, that is, to address the skew between the data signal and the clock signal.

Overall, two types of factors are known which cause the skew between a data signal and a clock signal. A first factor is the timing difference caused by the difference in the transmission line length between the data signal and the clock signal. The difference in the transmission line length is one major factor of the skew; this has been conventionally addressed by equal-length wiring. A second factor is waveform distortion caused by the frequency characteristics of the transmission lines, called ISI (inter-symbol interference). When the data transmission rate is increased, the skew caused by factor(s) other than the difference in the transmission line length, such as ISI, may be significant. This undesirably makes it difficult to design transmission lines.

Especially, 4K/2K display technologies and high-frame rate technologies have been recently developed, and use of these technologies is accompanied by a rapid increase in the transmission rate of image data. An increase in in the data transmission rate causes a reduction in the time duration of one UI and this undesirably decreases the time margin as illustrated in FIG. 1B. Conventionally, the reduction of the time duration of one UI have been addressed by reductions in the setup time and the hold time through the microfabrication of the semiconductor device; however, recent increases in the data transmission rate have made it difficult to maintain the time margin for achieving stable data transfer, only by reducing in the setup time and the hold time through the semiconductor device microfabrication.

From this background, there is a need for a technique for compensating the skew between a data signal and a clock signal in a data transfer system in which the data signal and the clock signal are transmitted over separate transmission lines.

Note that Japanese patent application publication No. 2014-168195 A discloses a technique for eliminating the skew. The receiver device disclosed in this patent document is configured to control the delay time of a variable delay circuit which delays at least one of a clock signal and a data signal, in response to skew detection data generated by a skew detection circuit.

SUMMARY

Therefore, one objective of the present disclosure is to provide a technique for compensating the skew between a data signal and a clock signal in a data transfer system in which the data signal and the clock signal are transmitted over separate transmission lines. A person skilled in the art would understand other objectives and new features from the following description.

In one embodiment, a semiconductor device includes: a first buffer configured to receive an external data signal and output a reception data signal corresponding to the external data signal; a second buffer configured to receive an external clock signal and output a reception clock signal in response to the external clock signal; a latch circuit configured to latch the reception data signal or a signal generated from the reception data signal in response to the reception clock signal, to output reception data corresponding to the reception data signal; a delay circuitry configured to delay one of the reception data signal and the reception clock signal from the other of the reception data signal and the reception clock signal by a set delay time set to the delay circuitry; and a delay control circuitry configured to control the set delay time. The delay control circuitry is configured to perform an initial setting operation, a first phase operation, a second phase operation, a third phase operation and an optimized value determination operation in a calibration process to determine the optimized value of the set delay time. The initial setting operation includes setting the set delay time to an initial value. The first phase operation includes searching a first delay time while increasing the set delay time from the initial value, where the first delay time is the set delay time with which a value of the reception data is stabilized to a first value. The second phase operation includes searching a second delay time while increasing the set delay time from the first delay time, where the second delay time is the set delay time with which the value of the reception data is stabilized to a second value different than the first value. The third phase operation includes searching a third delay time while decreasing the set delay time from the second delay time, where the third delay time is the set delay time with which the value of the reception data is stabilized to the first value. The optimized value determination operation includes determining an optimized value of the set delay time based on the first delay time and the third delay time.

A semiconductor device thus configured is suitably used in a data transfer system which achieves data transfer from a data transmitter to a data receiver.

Provided in another embodiment is an operation method of a semiconductor device which includes: a first buffer configured to receive an external data signal and output a reception data signal corresponding to the external data signal; a second buffer configured to receive an external clock signal and output a reception clock signal in response to the external clock signal; a latch circuit configured to latch the reception data signal or a signal generated from the reception data signal in response to the reception clock signal, to output reception data corresponding to the reception data signal; and a delay circuitry configured to delay one of the reception data signal and the reception clock signal from the other of the reception data signal and the reception clock signal by a set delay time set to the delay circuitry. The operation method includes performing a calibration process to determine an optimum value of the set delay time. The calibration process includes: an initial setting operation which includes setting the set delay time to an initial value; a first phase operation which includes searching a first delay time while increasing the set delay time from the initial value, where the first delay time is the set delay time with which the value of the reception data is stabilized to a first value; a second phase operation which includes searching a second delay time while increasing the set delay time from the first delay time, where the second delay time is the set delay time with which the value of the reception data is stabilized to a second value different than the first value; a third phase operation which includes searching a third delay time while decreasing the set delay time from the second delay time, where the third delay time is the set delay time with which the value of the reception data is stabilized to the first value; and an optimized value determination operation which includes determining an optimized value of the set delay time based on the first delay time and the third delay time.

The present disclosure provides a technique for compensating the skew between a data signal and a clock signal in a data transfer system in which the data signal and the clock signal are transmitted over separate transmission lines.

BRIEF DESCRIPTION OF THE DRAWINGS

FIG. 2 is a block diagram illustrating an exemplary configuration of a data transfer system in one embodiment;

FIG. 8 is a timing chart illustrating an example of the waveforms of a reception data signal and a delayed clock signal when a delay setting value of a variable delay circuit is set to an initial value D0;

FIG. 9A is a timing chart illustrating the waveform of an internal clock signal (the delayed clock signal) when the value of the reception data signal latched by a latch circuit is "L" for the delay setting value being set to the initial value D0, and the operation performed in the first phase in this case, when the reception data signal is latched with the delayed clock signal;

FIG. 9B is a timing chart illustrating the operation in the first phase when the internal clock signal is inverted, for the case when the value of the reception data signal latched by the latch circuit is "L" for the delay setting value being set to the initial value D0;

DETAILED DESCRIPTION OF PREFERRED EMBODIMENTS

Figure 1A:
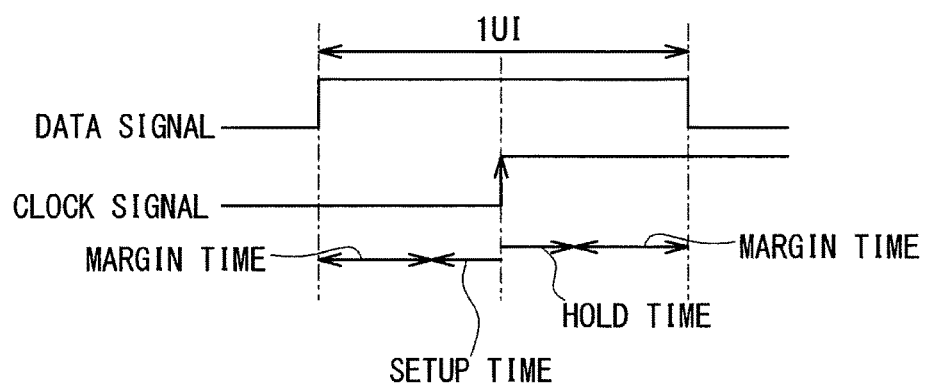
FIG. 1A is a timing chart illustrating an example of the phases of a data signal and a clock signal.
Figure 1B:
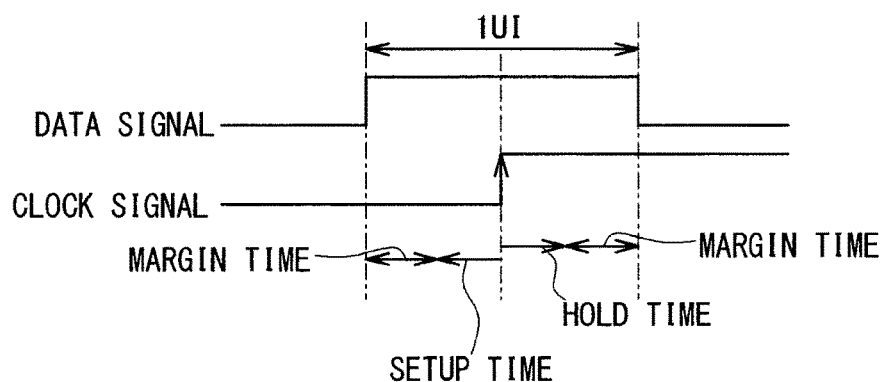
FIG. 1B is a timing chart illustrating a time margin when the time duration of one unit interval (UI) is reduced.

A description is given below of various preferred embodiments with reference to the attached drawings. It should be noted that same or similar elements may be denoted by same or corresponding reference numerals in the following description.

First Embodiment

FIG. 2 is a block diagram illustrating an exemplary configuration of a data transfer system in a first embodiment. The data transfer system 10 includes a data transmitter 1 and a data receiver 2. The data transmitter 1 is connected to the data receiver 2 via a data transmission line 3 transmitting a data signal and a clock transmission line 4 transmitting a clock signal. In one embodiment, the data transmitter 1 may be implemented as a first semiconductor device (or an integrated circuit (IC)) and the data receiver 2 may be implemented as a second semiconductor device (or an integrated circuit). In one example, the data transmitter 1 may be integrated in an application processor and the data receiver 2 may be integrated in a display driver which drives a display panel (e.g., a liquid crystal display panel and an OLED (organic light emitting diode) display panel).

Although the data transmission line 3 is illustrated as a single line in FIG. 2, the data transmission line 3 may include two signal lines transmitting differential signals when the data signal is transmitted as the differential signals. The similar goes for the clock transmission line 4; the clock transmission line 4 may include two signal lines transmitting differential signals when the clock signal is transmitted as the differential signals. In the following, the data signal transmitted over the data transmission line 3 is referred to as external data signal 5, and the clock signal transmitted over the clock transmission line 4 is referred to as external clock signal 6.

Figure 3:
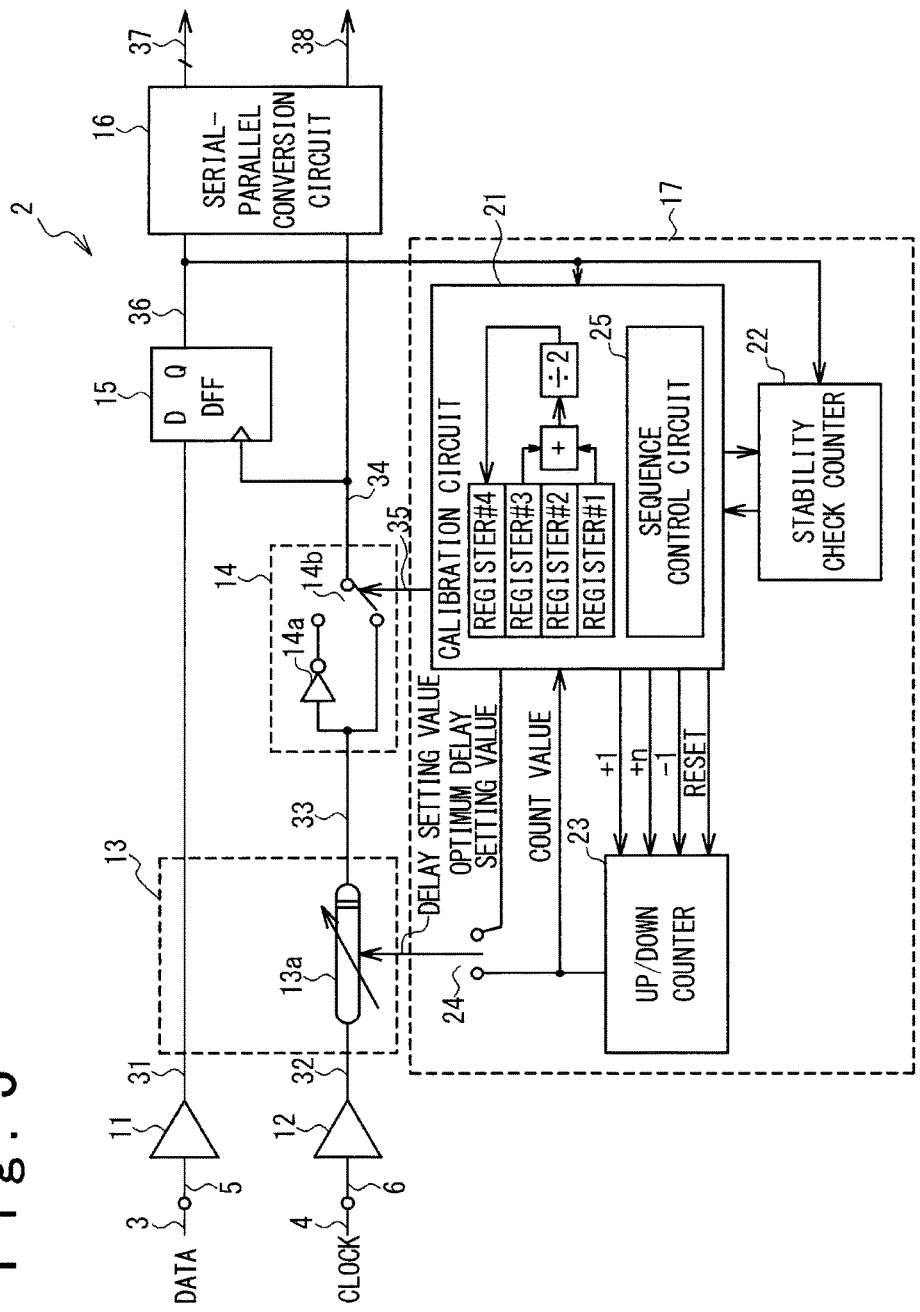
FIG. 3 is a block diagram illustrating an exemplary configuration of a data receiver in one embodiment.

FIG. 3 is a block diagram illustrating an exemplary configuration of the data receiver 2 in one embodiment. The data receiver 2 includes receiver buffers 11, 12, a delay circuitry 13, a clock inversion circuitry 14, a latch circuit 15, a serial-parallel conversion circuit 16, and a delay control circuitry 17.

The receiver buffer 11 receives the external data signal 5 transmitted over the data transmission line 3 and outputs a reception data signal 31 which is a single end signal corresponding to the received external data signal 5. Similarly, the receiver buffer 12 receives the external clock signal 6 transmitted over the clock transmission line 4 and outputs a reception clock signal 32 which is a single end signal corresponding to the received external clock signal 6.

The delay circuitry 13 is configured to delay one of the reception data signal 31 and the reception clock signal 32 from the other by a set delay time set to the delay circuitry 13. In the present embodiment, the delay circuitry 13 is configured to delay the reception clock signal 32 while outputting the reception data signal 31 without delay. The delay circuitry 13 includes a variable delay circuit 13a connected to the output of the receiver buffer 12. The variable delay circuit 13a delays the reception clock signal 32 by the set delay time set thereto to output a delayed clock signal 33. In the present embodiment, the set delay time set to the variable delay circuit 13a is specified by a delay setting value received from the delay control circuitry 17. For simplicity, the following description is given under an assumption that the set delay time set to the variable delay circuit 13a is increased as the delay setting value is increased.

The clock inversion circuitry 14 selects one of the delayed clock signal 33 and an inverted clock signal obtained by inverting the delayed clock signal 33 as an internal clock signal 34 and outputs the internal clock signal 34. The internal clock signal 34 output from the clock inversion circuitry 14 is used to latch the reception data signal 31 by the latch circuit 15. The clock inversion circuitry 14 includes an inverter 14a and a selector 14b. The inverter 14a generates the inverted clock signal by inverting the delayed clock signal 33. The selector 14b selects one of the delayed clock signal 33 and the inverted clock signal in response to a clock polarity inversion signal 35 received from the delay control circuitry 17, and outputs the selected clock signal as the internal clock signal 34.

The latch circuit 15 latches the reception data signal 31 in synchronization with the internal clock signal 34 to output reception data 36. It should be noted that, since the internal clock signal 34 is the delayed clock signal 33 or the inverted clock signal, which are both generated from the reception clock signal 32, the latch circuit 15 eventually latches the reception data signal 31 in synchronization with the reception clock signal 32. For simplicity, the following description is given under an assumption that the latch circuit 15 latches the reception data signal 31 in synchronization with rising edges of the internal clock signal 34, that is, latches the reception data signal 31 when the internal clock signal 34 is pulled up from the low level to the high level in the present embodiment. It should be noted that the latch circuit 15 may be configured to latch the reception data signal 31 in synchronization with falling edges of the internal clock signal 34, or configured to latch the reception data signal 31 in synchronization with both of rising and falling edges of the internal clock signal 34 as described later.

The serial-parallel conversion circuit 16 receives the reception data 36 in synchronization with the internal clock signal 34 and generates parallel data 37 by performing a serial-parallel conversion on the reception data 36. Additionally, the serial-parallel conversion circuit 16 generates a parallel data clock signal 38 synchronous with the parallel data 37 on the basis of the internal clock signal 34. The parallel data clock signal 38 is used to latch the parallel data 37 in a later-stage circuit.

The delay control circuitry 17 supplies to the variable delay circuit 13a a delay setting value which specifies the set delay time to be set to the variable delay circuit 13a. In the present embodiment, the delay control circuitry 17 is configured to perform a calibration process to calculate the delay setting value optimized for compensating the skew between the external data signal 5 and the external clock signal 6 received by the receiver buffers 11 and 12; hereinafter, the delay setting value such determined is simply referred to as the "optimum delay setting value". When the data transfer system 10 is placed into a calibration mode which is an operation mode to perform the calibration process, the delay control circuitry 17 performs the calibration process, that is, the operation of calculating the optimum delay setting value. As described layer, the delay control circuitry 17 calculates the optimum delay setting value on the basis of respective delay setting values set to the variable delay circuit 13a and the values of the reception data 36 for the respective delay setting values. In the normal operation, the delay control circuitry 17 sets the optimum delay setting value calculated in the calibration process to the variable delay circuit 13a.

In this embodiment, the delay control circuitry 17 includes: a calibration control circuit 21, a stability check counter 22, an up-down counter 23 and a selector 24. The calibration control circuit 21 controls the calibration process. The calibration control circuit 21 includes registers #1 to #4 and a sequence control circuit 25. Registers #1 to #4 are used to store data used in the calibration process and the optimum delay setting value calculated in the calibration process. A procedure to perform respective steps of the calibration process is programmed in the sequence control circuit 25, and, according to the programmed procedure, the sequence control circuit 25 outputs data and signals from the calibration control circuit 21 and receives data from the outside of the calibration control circuit 21.

The stability check counter 22 receives the reception data 36 from the latch circuit 15 and counts the number of times the same value appears in series in the reception data 36. As described later, the count value of the stability check counter 22 is used to confirm that the value of the reception data 36 is stabilized.

The up-down counter 23 increases and decreases the count value contained therein under control of the calibration control circuit 21. In the present embodiment, the up-down counter 23 receives a "+1" signal, a "+n" signal, a "−1" signal and a reset signal from the calibration control circuit 21. The up-down counter 23 increases the count value by one when the "+1" signal is activated and increases the count value by n when the "+n" signal is activated. The up-down counter 23 decreases the count value by one when the "−1" signal is activated and resets the count value to an initial value (e.g., "0") when the reset signal is activated.

Figure 4:
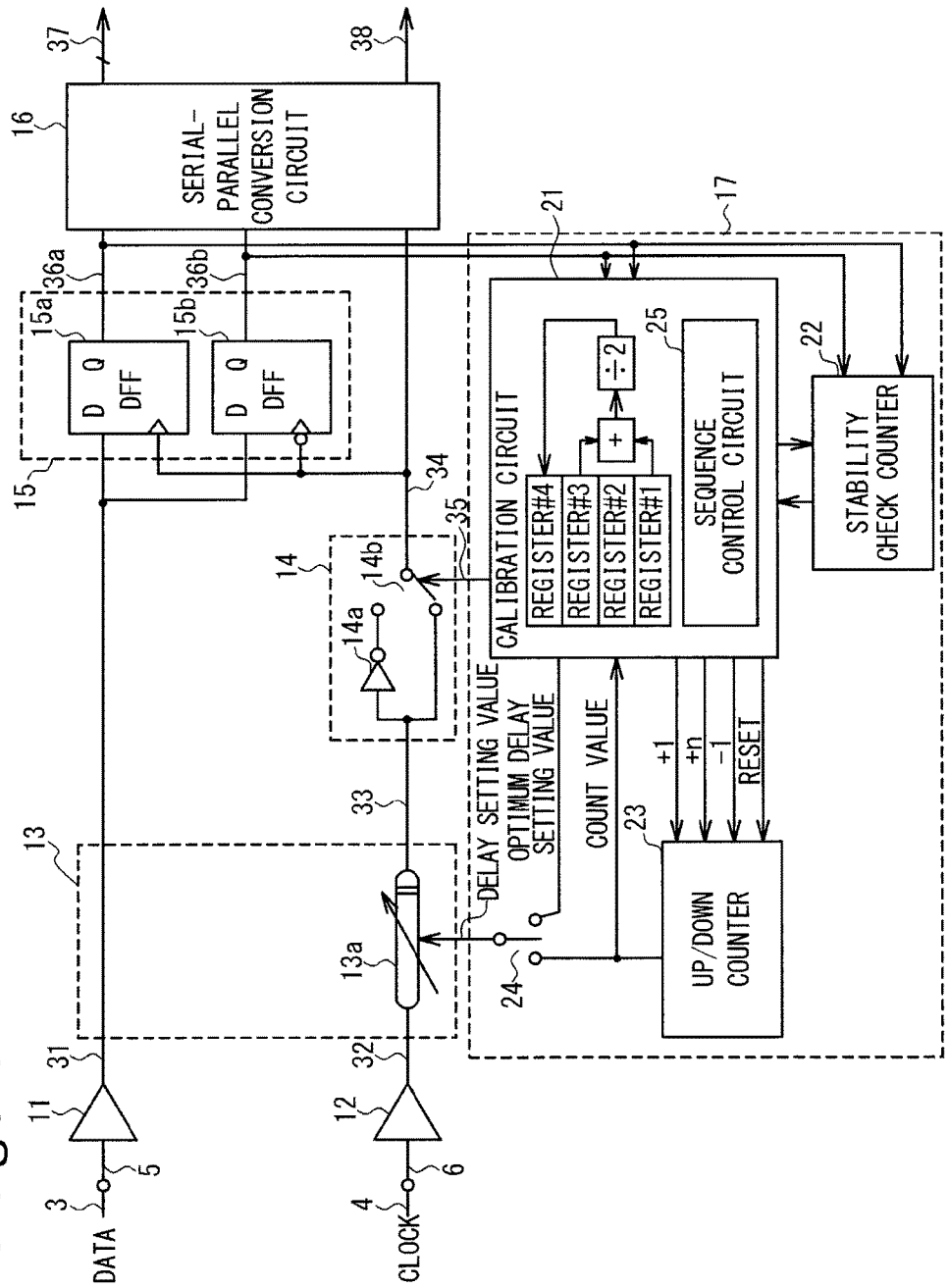
FIG. 4 is a block diagram illustrating a modified configuration of the data receiver.

The latch circuit 15 may be configured to latch the reception data signal 31 in synchronization with both of rising and falling edges of the internal clock signal 34. FIG. 4 is a block diagram illustrating an exemplary configuration of the data receiver 2 in this case. In the configuration illustrated in FIG. 4, the latch circuit 15 includes a latch 15a which latches the reception data signal 31 in response to rising edges of the internal clock signal 34 (that is, the delayed clock signal 33 or the inverted clock signal) to output reception data 36a and a latch 15b which latches the reception data signal 31 in response to falling edges of the internal clock signal 34 to output reception data 36b. The serial-parallel conversion circuit 16 generates parallel data 37 from the reception data 36a and 36b received from the latches 15a and 15b, and also generates parallel data clock signal 38 from the internal clock signal 34. The reception data 36a and 36b output from the latches 15a and 15b are supplied to the delay control circuitry 17 and used for processing performed in the delay control circuitry 17.

Figure 5:
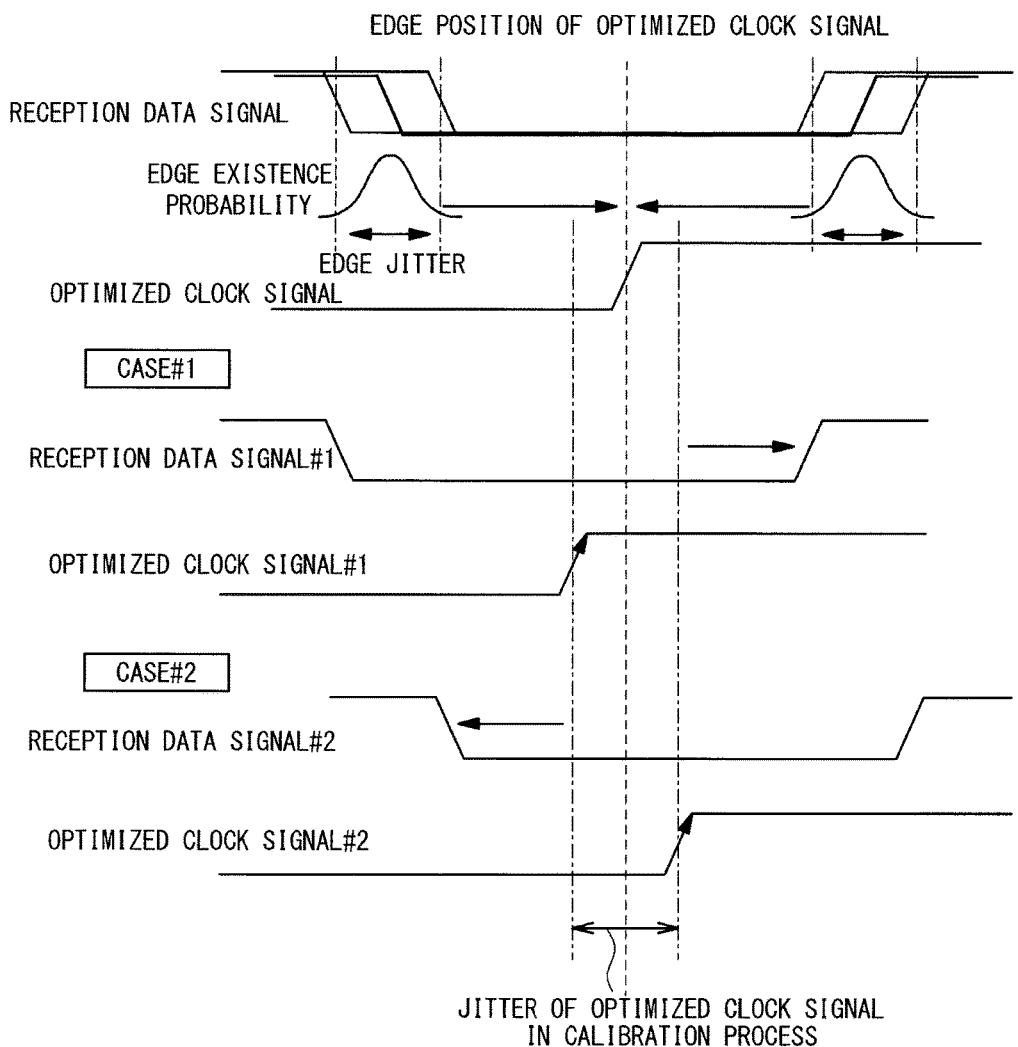
FIG. 5 is a timing chart illustrating variations in the positions of the edges of an optimized clock signal which may occur in a calibration process.

Next, a description is given of the calibration process performed in the data receiver 2 in the present embodiment. The objective of the calibration process is to optimize the phase of the internal clock signal 34 supplied to the latch circuit 15 in the normal operation, that is, to optimize the set delay time which is set to the variable delay circuit 13a. In the present embodiment, since the set delay time is specified by the delay setting value, the optimized value of the delay setting value to be set to the variable delay circuit 13a, that is, the optimum delay setting value is calculated in the calibration process. As illustrated in FIG. 5, the optimum delay setting value is to be determined so that edges of the internal clock signal 34, which is used to latch the reception data signal 31 by the latch circuit 15, are positioned at the intermediate positions of adjacent edges of the reception data signal 31. Hereinafter, the internal clock signal 34 adjusted so that the edges of internal clock signal 34 are positioned at the intermediate positions of adjacent edges of the reception data signal 31 is referred to as "optimized clock signal." FIG. 5 illustrates the edge positions of the "optimized clock signal" for various cases.

One issue is that the external data signal 5 and the external clock signal 6 are not necessarily subjected to noise of the same magnitude in the data transfer system 10 of this embodiment, in which the external data signal 5 and the external clock signal 6 are transmitted over separate transmission lines. When the calibration process is performed a plurality of times under this situation, the calculated optimum delay setting value may vary every when the calibration process is performed. This problem is significant especially in a noisy environment.

When the edge positions of the reception data signal 31 are shifted forward in the time domain in the calibration process (case #1 in FIG. 5), for example, the optimized clock signal is also shifted forward in the time domain. FIG. 5 illustrates the reception data signal 31 and the optimized clock signal in such a relationship as reception data signal #1 and optimized clock signal #1. When the edge positions of the reception data signal 31 are shifted backward in the time domain in the calibration process (case #2 in FIG. 5), the optimized clock signal is also shifted backward in the time domain. FIG. 5 illustrates the reception data signal 31 and the optimized clock signal in such a relationship as reception data signal #2 and optimized clock signal #2. The fact that the calculated optimum delay setting value may vary when the calibration process is performed can be undesirable for stably transferring data over the data transfer system 10.

To address this problem, in the present embodiment, the calibration process is performed in such a procedure that the variations in the calculated optimum delay setting value are suppressed. Given below is a detailed description of the calibration process in the present embodiment.

Figure 6:
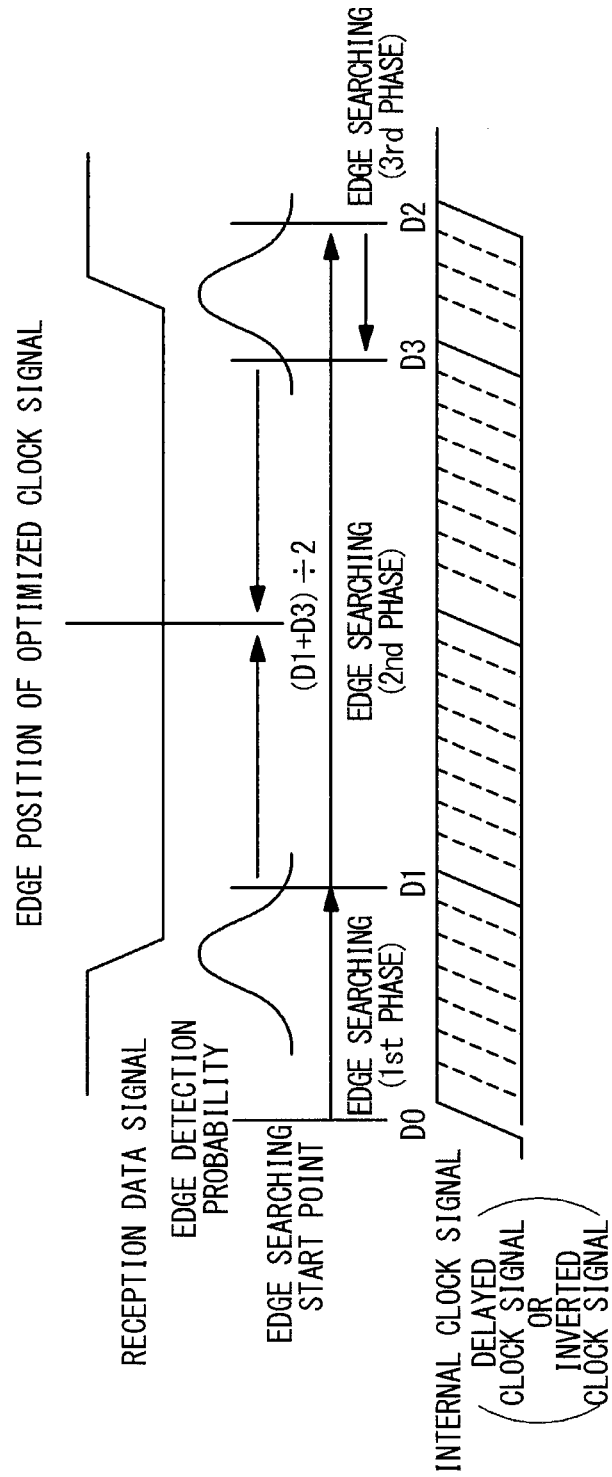
FIG. 6 is a timing chart illustrating an overview of the calibration process in the present embodiment.

FIG. 6 is a timing chart illustrating an overview of the calibration process in the present embodiment. The calibration process includes three phases, hereinafter referred to as first to third phases, respectively, in the present embodiment.

In the first phase, the minimum set delay time is searched while the set delay time of the variable delay circuit 13a is increased from an initial value (typically, the minimum delay time of the variable delay circuit 13a), so that the value of the reception data 36 output from the latch circuit 15 is stabilized to "L" with the searched set delay time after the value of the reception data 36 is switched from "H" to "L". More specifically, the minimum delay setting value is searched while the delay setting value set to the variable delay circuit 13a is increased from an initial value (typically, "0"), so that the value of the reception data 36 is stabilized to "L" with the searched delay setting value after the value of the reception data 36 is switched from "H" to "L". Hereinafter, the initial value of the delay setting value set to the variable delay circuit 13a is referred to as initial value "D0", and the delay setting value obtained through the searching in the first phase is referred to as the delay setting value D1.

In the second phase, such a set delay time that the value of the reception data 36 is stabilized to "H" after the value of the reception data 36 is switched from "L" to "H" is searched, while the set delay time of the variable delay circuit 13a is further increased. More specifically, such a delay setting value that the value of the reception data 36 is stabilized to "H" after the value of the reception data 36 is switched from "L" to "H" is searched, while the delay setting value set to the variable delay circuit 13a is increased from the delay setting value D1. Hereinafter, the delay setting value obtained by the searching in the second phase is referred to as the delay setting value D2.

In the third phase, the maximum set delay time is searched while the set delay time of the variable delay circuit 13a is decreased from the set delay time obtained in the second phase, so that the value of the reception data 36 is stabilized to "L" with the searched set delay time after the value of the reception data 36 is switched from "H" to "L". More specifically, the maximum set delay time is searched while the set delay time of the variable delay circuit 13a is decreased from the set delay time obtained in the second phase, so that the value of the reception data 36 is stabilized to "L" with the searched set delay time after the value of the reception data 36 is switched from "H" to "L". Hereinafter, the delay setting value obtained by the searching in the third phase is referred to as the delay setting value D3.

The optimized set delay time set to the variable delay circuit 13a can be obtained on the basis of the set delay time obtained through the searching in the first phase and that obtained through the searching in the third phase. That is, the optimum delay setting value is calculated on the basis of the delay setting value D1 obtained through the searching in the first phase and the delay setting value D3 obtained through the searching in the third phase. In the present embodiment, the optimized value of the set delay time is calculated as the average of the set delay time obtained through the searching in the first phase and that obtained through the searching in the third phase. That is, the optimum delay setting value is calculated as the average value of the delay setting values D1 and D3.

This method effectively reduces variations in the optimized value of the set delay time obtained in the calibration process, that is, the optimum delay setting value obtained in the calibration process. In the method of the present embodiment, the delay setting values D1 and D3 used to calculate the optimum delay setting value are determined as the minimum and maximum delay setting values, respectively, with which the value of the reception data 36 is stabilized to "L", and this effectively suppresses variations in the delay setting values D1 and D3. The suppression of variations in the delay setting values D1 and D3 effectively reduces variations in the optimized value of the set delay time obtained in the calibration process, that is, the optimum delay setting value obtained in the calibration process.

It should be noted that the values "L" and "H" of the reception data 36 merely mean one of the two values of a single end signal (a first value) and the other of the two values, respectively, in the description given in the above (and in the following).

A detailed description is then given of the operation of the data receiver 2 in the calibration process. In the calibration process in the present embodiment, a signal in which the data value is switched between "L" and "H" at every UI is supplied as the external data signal 5. The following discussion is given under an assumption that, in the initial state in the calibration process, the clock polarity inversion signal 35 is deactivated and therefore the delayed clock signal 33 (not the inverted clock signal generated by the inverter 14a) is selected as the internal clock signal 34.

Figure 7:
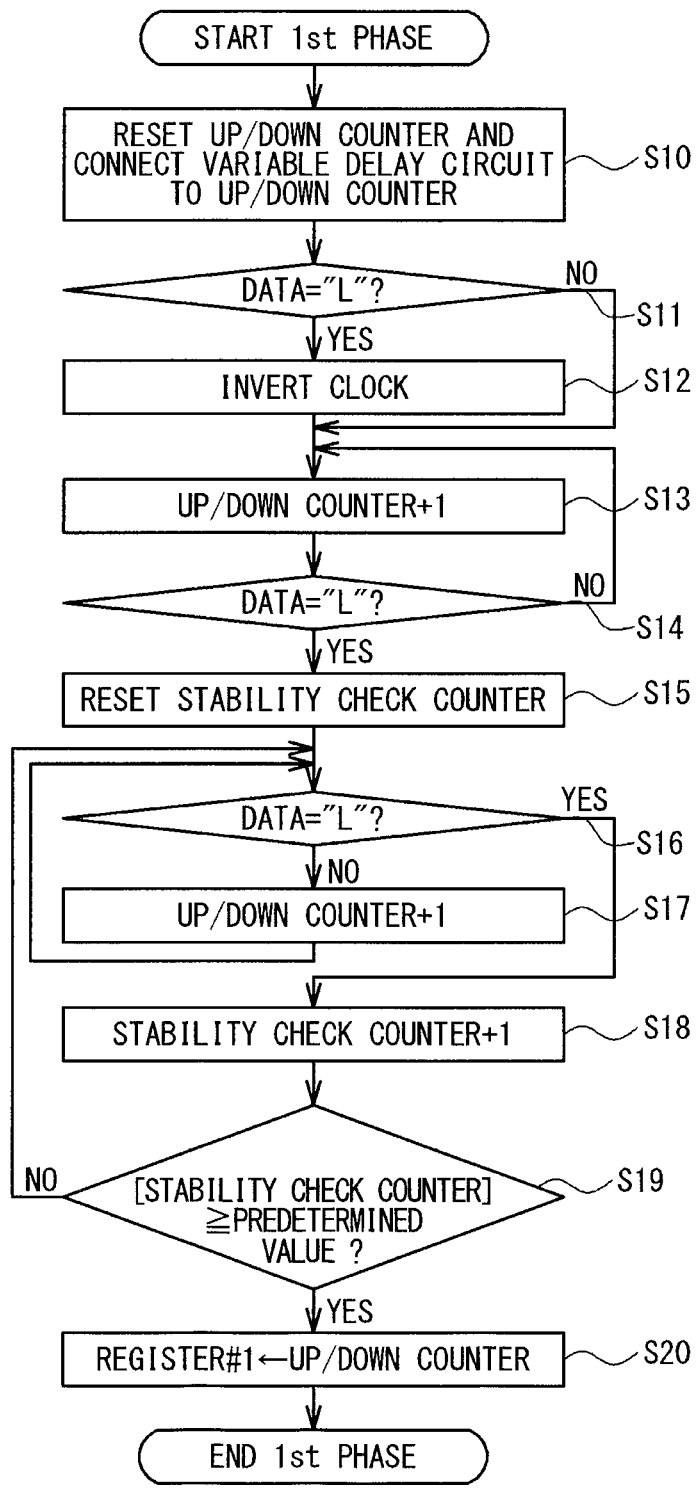
FIG. 7 is a flowchart illustrating an exemplary operation of the data receiver in a first phase.

FIG. 7 is a flowchart illustrating the operation of the data receiver 2, particularly, the operation of the delay control circuitry 17 in the first phase. As described above, in the first phase, the minimum delay setting value D1 is searched while the delay setting value set to the variable delay circuit 13a is increased from an initial value, so that the value of the reception data 36 is stabilized to "L" with the delay setting value D1 after the value of the reception data 36 is switched from "H" to "L".

In the first phase, the up-down counter 23 is first reset and the variable delay circuit 13a is then connected to the up-down counter 23 (step S10). More specifically, at step S10, the reset signal is activated by the calibration control circuit 21 to reset the count value of the up-down counter 23 to the initial value (typically, "0"). Additionally, the count value of the up-down counter 23 is selected as the delay setting value to be set to the variable delay circuit 13a by the selector 24 and thereby the delay setting value of the variable delay circuit 13a is set to the initial value D0. FIG. 8 illustrates an example of waveforms of the reception data signal 31 and the delayed clock signal 33 when the delay setting value of the variable delay circuit 13a is set to the initial value D0.

This is followed by determining the value of the reception data 36 by the calibration control circuit 21 (step S11). When the value of the reception data 36 determined at step S11 is "L", the clock polarity inversion signal 35 is activated to invert the internal clock signal 34 (step S12). More specifically, the inverted clock signal is selected by the selector 14b in response to the activation of the clock polarity inversion signal 35 and the inverted clock signal is thereafter used as the internal clock signal 34.

The aim of the operations at steps S11 and S12 is to rapidly complete the searching in first phase. As described above, the minimum delay setting value D1 is searched in the first phase, which is determined so that the value of the reception data 36 is stabilized to "L" with the delay setting value D1 after the value of the reception data 36 is switched from "H" to "L". When the value of the reception data 36 is "L" for the delay setting value being set to the initial value D0 as illustrated in FIG. 9A, this requires searching such the minimum delay setting value in the first phase that the value of the reception data 36 is stabilized to "L" after the value is switched from "L" to "H" and then from "H" to "L". Such operation undesirably increases the time required for completing the searching in the first phase.

As illustrated in FIG. 9B, if the internal clock signal 34 is inverted (that is, if the inverted clock signal is selected as the internal clock signal 34) when the value of the reception data 36 is "L" for the delay setting value being set to the initial value D0, this allows setting the value of the reception data 36 to "H" for the delay setting value being set to the initial value D0. Accordingly, the operations at steps S11 and S12 allows completing the searching in the first phase in a short time.

Referring back to FIG. 7, the procedure in the first phase then goes to steps S13 and S14. At steps S13 and S14, the count value of the up-down counter 23, that is, the delay setting value set to the variable delay circuit 13a is increased one by one until the value of the reception data 36 becomes "L". The increment with which the delay setting value is increased at steps S13 and S14 in the first phase is one. As described above, the count value of the up-down counter 23 can be increased by one by activating the "+1" signal supplied from the calibration control circuit 21 to the up-down counter 23.

When the value of the reception data 36 is determined as "L" for a certain delay setting value at step S14, it is determined whether the value of the reception data 36 is stabilizes to "L" with this delay setting value at steps S15 to S19.

More specifically, the stability check counter 22 is first reset (step S15) and it is then determined again whether the value of the reception data 36 is "L" in this state (step S16).

When the value of the reception data 36 is not determined as "L" at step S16, the count value of the up-down counter 23 is increased by one (step S17) and it is determined again whether the value of the reception data 36 is "L" (step S16).

When the value of the reception data 36 is determined as "L" at step S16, the count value of the stability check counter 22 is increased by one (step S18).

Step S18 is followed by determining whether the count value of the stability check counter 22 reaches a predetermined reference value (step S19). When the count value of the stability check counter 22 does not reach the predetermined reference value, steps S16 to S18 are performed again. Steps S16 to S18 are repeated until the count value of the stability check counter 22 reaches the predetermined reference value.

Figure 10:
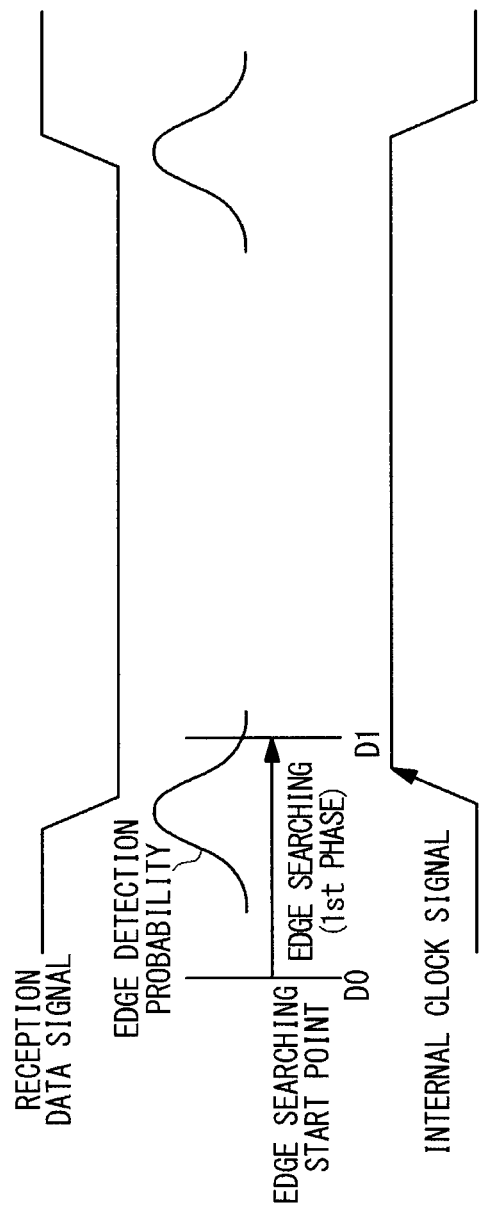
FIG. 10 is a timing chart illustrating the relation between the delay setting value D1 obtained in the first phase and the waveform of the reception data signal.

The count value of the up-down counter 23 at the moment when the count value of the stability check counter 22 reaches the predetermined reference value, that is, the delay setting value set to the variable delay circuit 13a at this moment is determined as the delay setting value D1. FIG. 10 illustrates the relation between the delay setting value D1 obtained in the first phase and the phase of the reception data signal 31. The delay setting value D1 is stored and held in register #1 of the calibration control circuit 21 (step S19). This completes the first phase.

Figure 11:
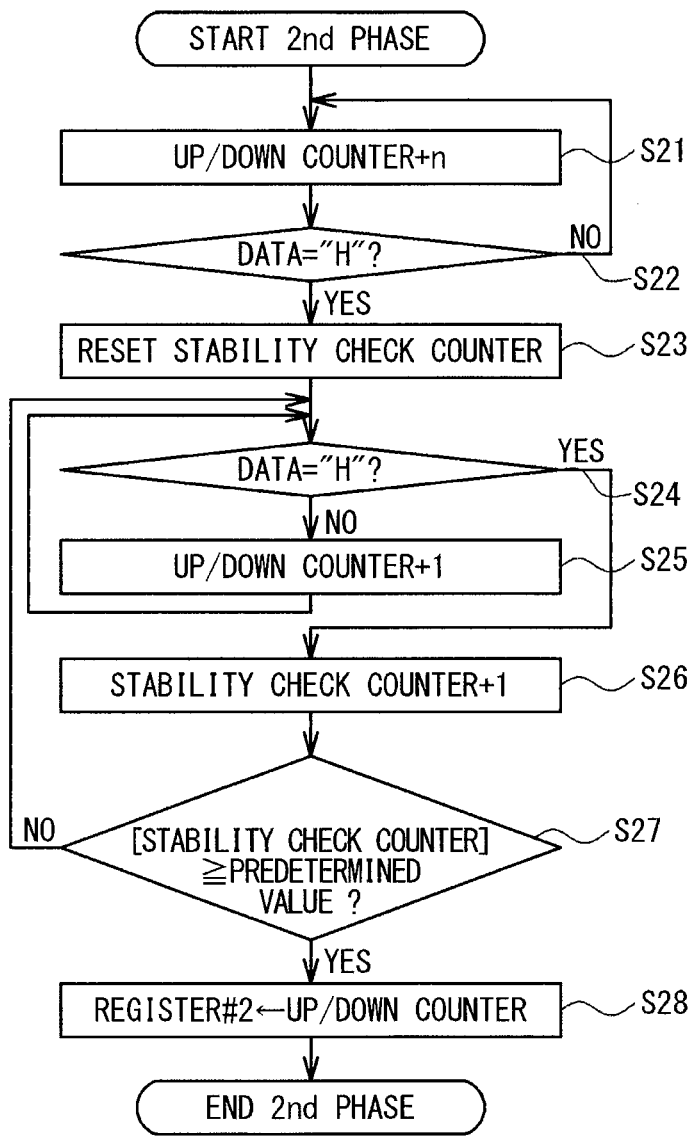
FIG. 11 is a flowchart illustrating an exemplary operation of the data receiver in a second phase.
Figure 12:
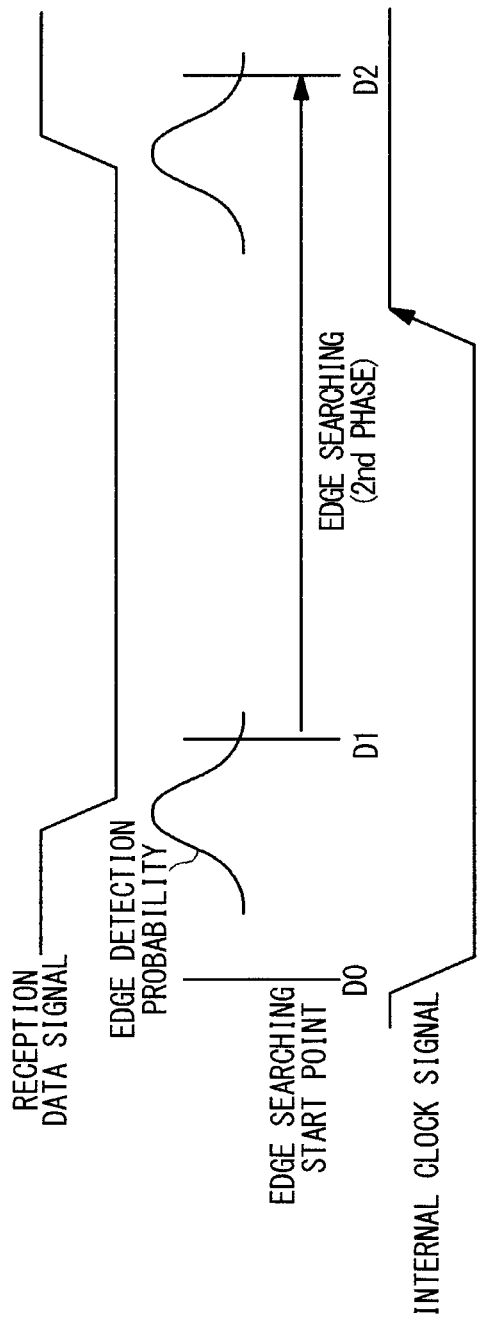
FIG. 12 is a timing chart illustrating the relation between the delay setting value D2 obtained in the second phase and the waveform of the reception data signal.

FIG. 11 is a flowchart illustrating the operation of the data receiver 2, particularly, the operation of the delay control circuitry 17 in the second phase and FIG. 12 is a timing chart illustrating the relation between the delay setting value D2 obtained in the second phase and the waveform of the reception data signal 31. In the second phase, a delay setting value D2 is searched while the delay setting value set to the variable delay circuit 13a is increased from the delay setting value D1, so that the value of the reception data 36 is stabilized to "H" with the delay setting value D2 after the value of the reception data 36 is switched from "L" to "H".

In the second phase, the count value of the up-down counter 23, that is, the delay setting value set to the variable delay circuit 13a is first increased from the delay setting value D1 with increments of n (>1), until the value of the reception data 36 becomes "H" (steps S21 and S22). More specifically, the count value of the up-down counter 23 is increased by n (step S21) and the value of the reception data 36 is determined in this state (step S22). It should be noted that the count value of the up-down counter 23 can be increased by n through activating the "+n" signal supplied from the calibration control circuit 21 to the up-down counter 23. Steps S21 and S22 are repeated until the value of the reception data 36 becomes "H".

It should be noted that the increment with which the delay setting value is increased at steps S21 and S22 in the second phase is n (>1), which is larger than the increment with which the delay setting value is increased in the first phase (that is, one). In other words, the increment with which the set delay time of the variable delay circuit 13a is increased at steps S21 and S22 in the second phase is larger than that with which the set delay time of the variable delay circuit 13a is increased in the first phase. This effectively contributes reduction in the time necessary for searching the delay setting value D2 in the second phase. Since the delay setting value D2 searched in the second phase is defined as the minimum delay setting value with which the value of the reception data 36 is stabilized to "H" after the value of the reception data 36 is switched from "L" to "H", the delay setting value D2 searched in the second phase is relatively largely different from the delay setting value D1. Accordingly, the time necessary for the searching of the delay setting value D2 in the second phase can be effectively reduced by increasing the increment with which the delay setting value is increased at steps S21 and S22. It should be also noted that the accuracy of the delay setting value D2 is allowed to be low, because the delay setting value D2 searched in the second phase is used only as the initial value of the searching of the delay setting value D3, not directly used to calculate the optimum delay setting value. The increase in the increment with which the delay setting value is increased at steps S21 and S22 does not cause deterioration in the accuracy of the calculation of the optimum delay setting value.

When the value of the reception data 36 is determined as "H" for a certain delay setting value at step S22, it is determined whether the value of the reception data 36 is stabilized to "H" with this delay setting value at steps S23 to S27.

More specifically, the stability check counter 22 is first reset (step S23) and it is determined again whether the value of the reception data 36 is "H" in this state (step S24).

When the value of the reception data 36 is not "H" at step S24, the count value of the up-down counter 23 is increased by one (step S25) and it is determined again whether the value of the reception data 36 is "H" (step S24).

When the value of the reception data 36 is determined as "H" at step S24, the count value of the stability check counter 22 is increased by one (step S26).

Step S26 is followed by determining whether the count value of the stability check counter 22 reaches a predetermined reference value (step S27). When the count value of the stability check counter 22 does not reach the predetermined reference value, steps S24 and S26 are performed again. Steps S24 to S26 are repeated until the count value of the stability check counter 22 reaches the predetermined reference value.

The count value of the up-down counter 23 at the moment when the count value of the stability check counter 22 reaches the predetermined reference value, that is, the delay setting value set to the variable delay circuit 13a at this moment is determined as the delay setting value D2. The delay setting value D2 is stored and held in register #2 in the calibration control circuit 21 step S28. This completes the second phase.

Figure 13:
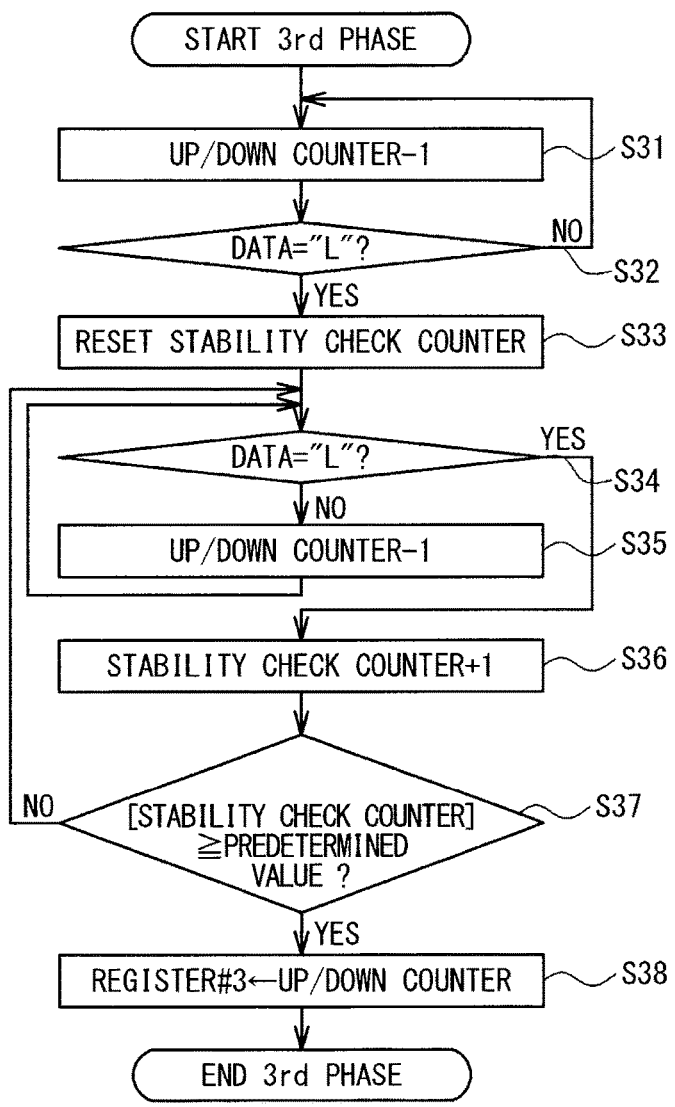
FIG. 13 is a flowchart illustrating an exemplary operation of the data receiver in a third phase.
Figure 14:
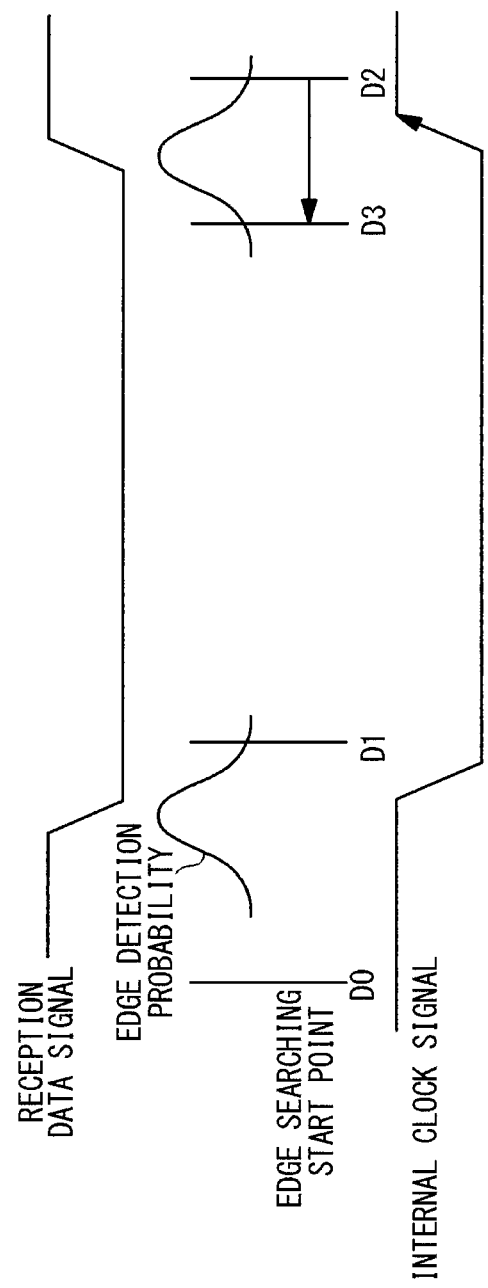
FIG. 14 is a timing chart illustrating the relation between the delay setting value D3 obtained in the third phase and the waveform of the reception data signal.

FIG. 13 is a flowchart illustrating the operation of the data receiver 2, particularly, the operation of the delay control circuitry 17 in the third phase and FIG. 14 is a timing chart illustrating the relation between the delay setting value D3 obtained in the third phase and the waveform of the reception data signal 31. In the third phase, the delay setting value D3 is searched while the delay setting value set to the variable delay circuit 13a is decreased from the delay setting value D2, so that the value of the reception data 36 is stabilized to "L" with the delay setting value D3 after the value of the reception data 36 is switched from "H" to "L".

In the third phase, the count value of the up-down counter 23, that is, the delay setting value set to the variable delay circuit 13a is decreased from the delay setting value D2 with decrements of one, until the value of the reception data 36 becomes "L" (steps S31 and S32). More specifically, the count value of the up-down counter 23 is decreased by one (step S31) and the value of the reception data 36 is determined in this state (step S32). Steps S31 and S32 are repeated until the value of the reception data 36 is determined as "L". The decrement with which the delay setting value is decreased at steps S31 and S32 in the third phase is one. It should be noted that the count value of the up-down counter 23 can be decreased by one through activating the "−1" signal supplied from the calibration control circuit 21 to the up-down counter 23.

When the value of the reception data 36 is determined as "L" for a certain delay setting value at step S32, it is determined at steps S33 to S37 whether the value of the reception data 36 is stabilized to "L" with this delay setting value.

More specifically, the stability check counter 22 is first reset (step S33) and it is then determined again whether the value of the reception data 36 is "L" in this state (step S34).

When the value of the reception data 36 is not determined as "L" at step S34, the count value of the up-down counter 23 is decreased by one step S35 and it is determined again whether the value of the reception data 36 is "L" (step S34).

When the value of the reception data 36 is determined as "L" at step S34, the count value of the stability check counter 22 is increased by one (step S36).

Step S36 is followed by determining whether the count value of the stability check counter 22 reaches a predetermined reference value (step S37). When the count value of the stability check counter 22 does not reach the predetermined reference value, steps S34 to S36 are performed again. Steps S34 to S36 are repeated until the count value of the stability check counter 22 reaches the predetermined reference value.

The count value of the up-down counter 23 at the moment when the count value of the stability check counter 22 reaches the predetermined reference value, that is, the delay setting value set to the variable delay circuit 13a at this moment is determined as the delay setting value D3. The delay setting value D3 is stored and held in register #3 in the calibration control circuit 21 (step S38). This completes the third phase.

Figure 15:
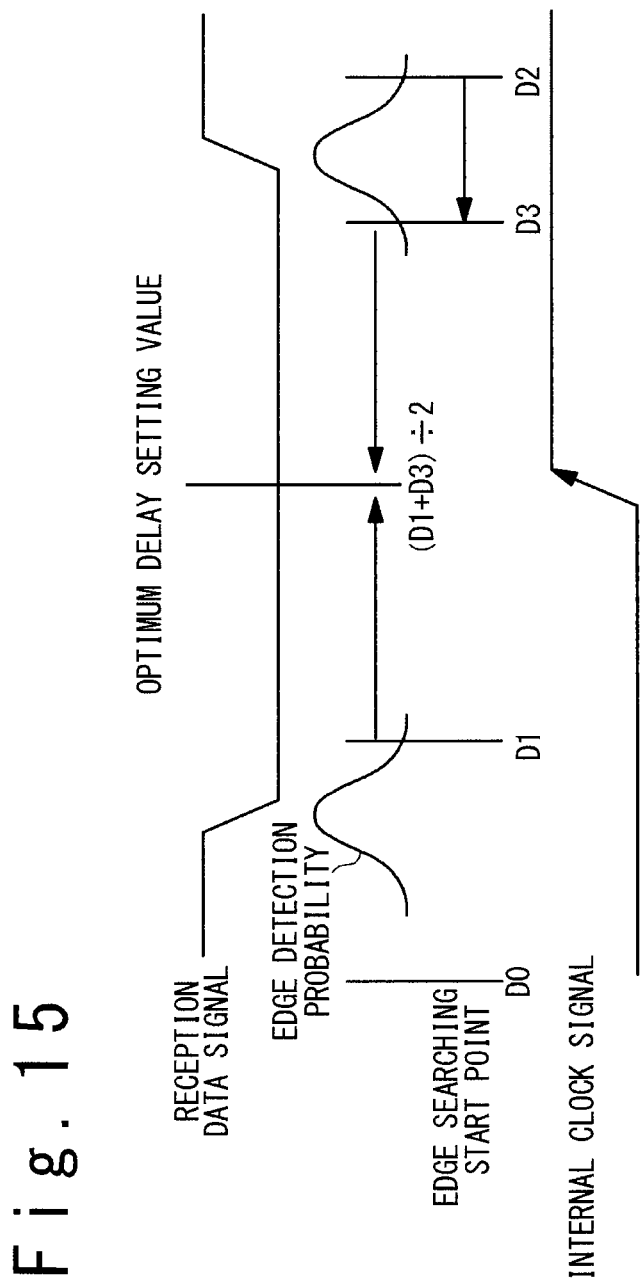
FIG. 15 is a timing chart illustrating a calculation method of the optimum delay setting value and the relation between the optimum delay setting value and the waveform of the reception data signal.

As illustrated in FIG. 15, the optimum delay setting value is calculated on the basis of the delay setting value D1 obtained by the searching in the first phase and the delay setting value D3 obtained by the searching in the third phase. The optimum delay setting value is calculated by the calibration control circuit 21. In the present embodiment, the optimum delay setting value is determined as the average value (D1+D3)/2 of the delay setting values D1 and D3. The optimum delay setting value thus calculated is stored in register #4 to complete the calibration process.

In the normal operation, the optimum delay setting value stored in register #4 is selected by the selector 24 and set to the variable delay circuit 13a. Setting the optimum delay setting value thus calculated to the variable delay circuit 13a allows appropriately adjusting the phase difference between the reception data signal 31 and the internal clock signal 34 and thereby compensating the skew between the external data signal 5 and the external clock signal 6.

It should be noted that the method of this embodiment described above effectively suppresses variations in the optimum delay setting value calculated in the calibration process. Since the delay setting values D1 and D3, which are used to calculate the optimum delay setting value, are determined as the minimum and maximum delay setting values with which the value of the reception data 36 is stabilized to "L", respectively, it is possible to reduce the variations in the delay setting values D1 and D3 even when the calibration process is performed a plurality of times. This effectively suppresses variations in the optimum delay setting value calculated in the calibration process.

Another advantage of the calibration process of the present embodiment is flexibility in implementation; the first to third phases of the calibration process of the present embodiment can be separately implemented. For example, if the delay setting value D1 obtained in the first phase is stored in register #1 of the calibration control circuit 21 upon completion of the first phase and the delay setting value D1 is read out from register #1 and set to the up-down counter 23 upon initiation of the second phase, this eliminates the need of subsequently performing the second phase after the first phase. Similarly, if the delay setting value D2 obtained in the second phase is stored in register #2 of the calibration control circuit 21 upon completion of the second phase and the delay setting value D2 is read out from register #2 and set to the up-down counter upon initiation of the third phase, this eliminates the need of subsequently performing the third phase after the second phase. Each of the first to third phases can be completed in a relatively short time, this means that separately performing the first to third phases allows effective use of data transfer idle time.

Normal data transfer (that is, data transfer using the external data signal 5 and the external clock signal 6) may be performed during a period between the first phase and the second phase. As described above, in the normal data transfer, the optimum delay setting value stored in register #4 is selected by the selector 24 and set to the variable delay circuit 13a. Similarly, normal data transfer may be performed during a period between the second phase and the third phase. When the third phase is completed, the optimum delay setting value is calculated from the delay setting values D1 and D3 obtained in the first and third phases and stored in register #4. This achieves update of the optimum delay setting value. A next data transfer is performed with the updated optimum delay setting value set to the variable delay circuit 13a.

Figure 16:
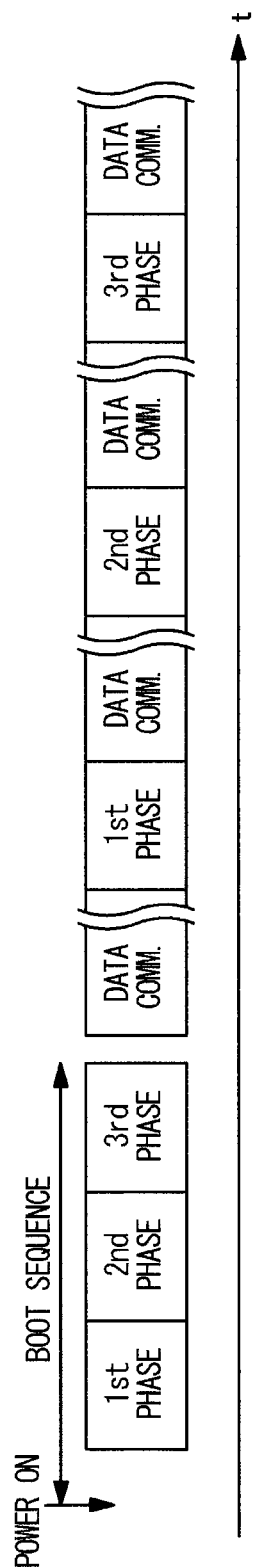
FIG. 16 is a timing chart illustrating an example of the operation of the data transfer system in which the first, second and third phases are separately performed in the calibration process.

FIG. 16 is a timing chart illustrating an example of the operation of the data transfer system when the calibration process is performed in which the first to third phases are separately performed. When the data transfer system 10 is booted (when the power supply is turned on, for example), a boot sequence is initiated. The above-described calibration process is performed in the boot sequence. In this calibration process, the first to third phases are performed in series.

Data transfer over the data transfer system 10 is then started. In a calibration process after the data transfer is started, the first to third phases are separately performed. The data transfer is once stopped at desired timing, and the first phase is performed. After the first phase is completed, the data transfer is restarted. Thereafter, the data transfer is stopped again at desired timing, and the second phase is performed. After the second phase is completed, the data transfer is restarted. Thereafter, the data transfer is stopped again at desired timing, and the third phase is performed. The optimum delay setting value is calculated after the third phase is completed. Thereafter, the optimum delay setting value thus calculated is set to the variable delay circuit 13a in the data transfer.

When the data transfer system 10 of the present embodiment is used to supply image data and control data to a display driver which drives a display panel in a display device (in this case, the data receiver 2 is integrated in the display driver), the first to third phases are each implemented in a vertical blanking period. In one example, the first phase may be implemented in a vertical blanking period of a first vertical synchronization period, the second phase may be implemented in a vertical blanking period of a second vertical synchronization period later than the first vertical synchronization period, and the third phase may be implemented in a vertical blanking period of a third vertical synchronization period later than the second vertical synchronization period. Note that the second vertical synchronization period may not be the vertical synchronization period immediately following the first vertical synchronization period, and the third vertical synchronization period may not be the vertical synchronization period immediately following the second vertical synchronization period.

When the first to third phases are separately implemented, there may be an influence of time-dependent variations. When the second phase is performed after a certain duration of time has passed after the completion of the first phase, the delay setting value D1 determined in the first phase may become unsuitable due to time-dependent variations. Similarly, when the third phase is performed after a certain duration of time has passed after the completion of the second phase, the delay setting value D2 determined in the second phase may become unsuitable due to time-dependent variations.

Figure 17A:
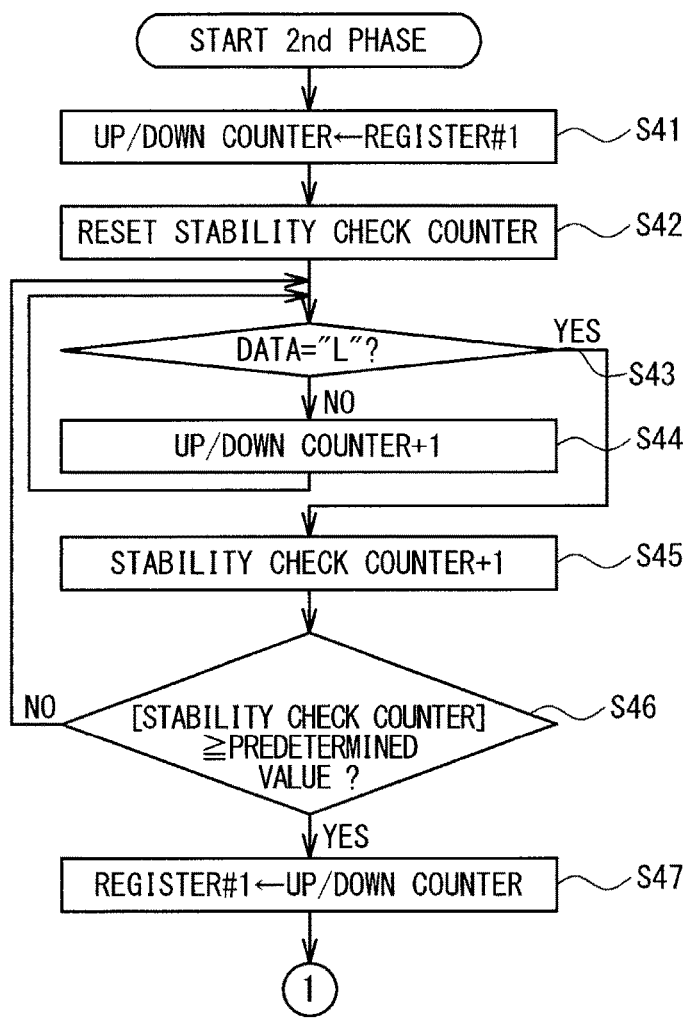
FIGS. 17A and 17B are flowcharts illustrating an exemplary operation in the second phase, suitable for suppressing an influence of time-dependent variations when the first and second phases are separately performed.
Figure 17B:
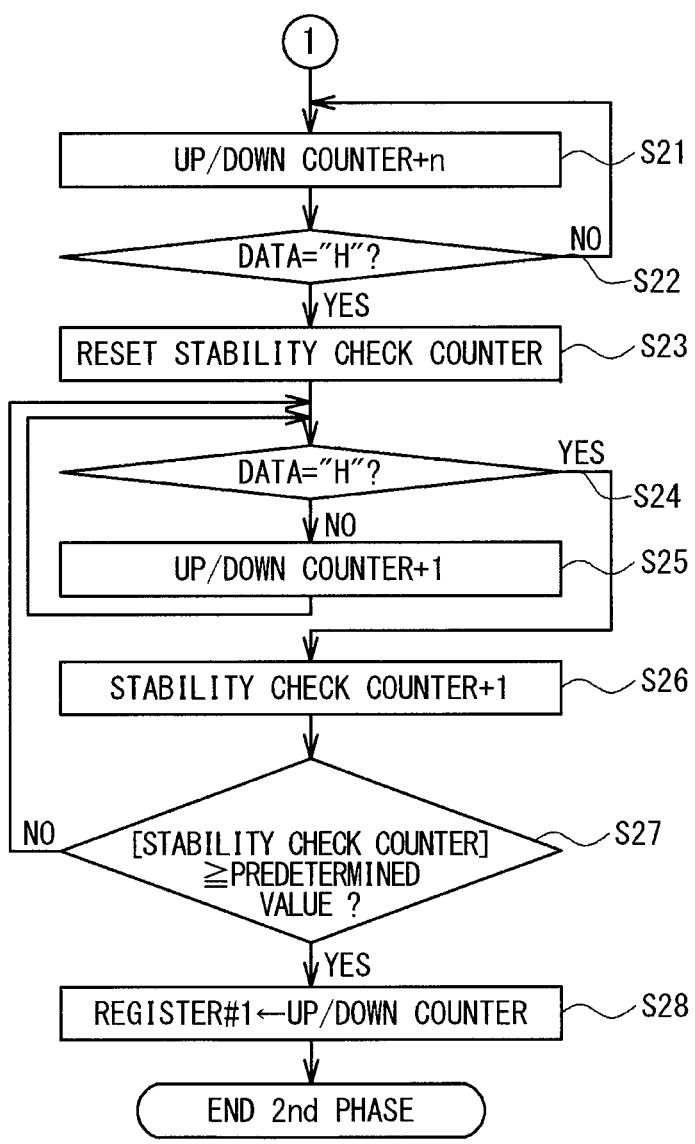

To suppress undesired influences caused by time-dependent variations, it can be preferable to modify the procedures of the second and third phases as follows:

FIGS. 17A and 17B are flowcharts illustrating a preferred procedure of the second phase to suppress influences potentially caused by time-dependent variations. As illustrated in FIG. 17A, when the second phase is initiated, the delay setting value D1 stored in register #1 is set to the up-down counter 23 as the count value (step S41). Additionally, the count value of the up-down counter 23 is selected by the selector 24 as the delay setting value to be set to the variable delay circuit 13a. As a result, the delay setting value D1 is set to the variable delay circuit 13a.

At steps S42 to S46, it is determined whether the value of the reception data 36 is stabilized to "L" by setting the delay setting value D1 to the variable delay circuit 13a.

More specifically, the stability check counter 22 is first reset (step S42) and it is determined whether the value of the reception data 36 is "L" (step S43).

When the value of the reception data 36 is not "L" at step S43, the count value of the up-down counter 23 is increased by one (step S44), and it is determined again whether the value of the reception data 36 is "L" (step S43).

When the value of the reception data 36 is determined as "L" at step S43, the count value of the stability check counter 22 is increased by one (step S45).

Step S45 is followed by determining whether the count value of the stability check counter 22 reaches a predetermined reference value (step S46). When the count value of the stability check counter 22 does not reach the predetermined reference value, steps S43 to S45 are performed again. Steps S43 to S45 are repeated until the count value of the stability check counter 22 reaches the predetermined reference value.

The count value of the up-down counter 23 at the moment when the count value of the stability check counter 22 reaches the predetermined reference value is determined as suitable for the delay setting value D1. The count value of the up-down counter 23 at this moment is stored as a new delay setting value D1 into register #1.

As illustrated in FIG. 17B, the subsequent procedure is the same as steps S21 to S28 of the second phase illustrated in FIG. 11.

The above-described procedure, in which the delay setting value D1 is adjusted, effectively suppresses influences caused by time-dependent variations even after the optimum value of the delay setting value D1 has varied due to the time-dependent variations.

Figure 18A:
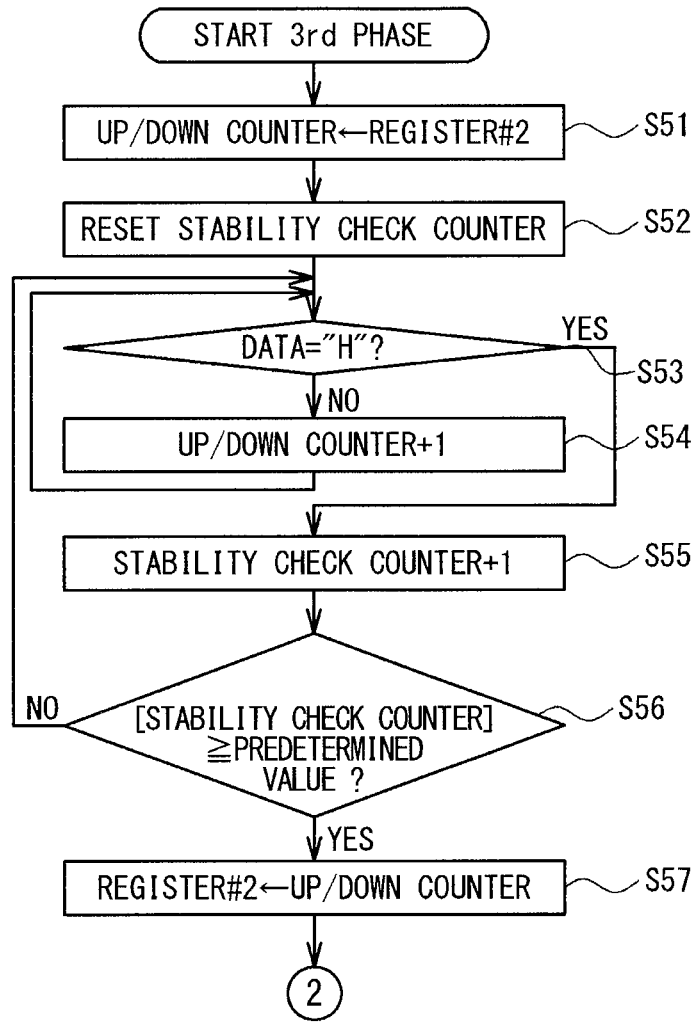
FIGS. 18A and 18B are flowcharts illustrating an exemplary operation in the third phase, suitable for suppressing an influence of time-dependent variations when the second and third phases are separately performed.
Figure 18B:
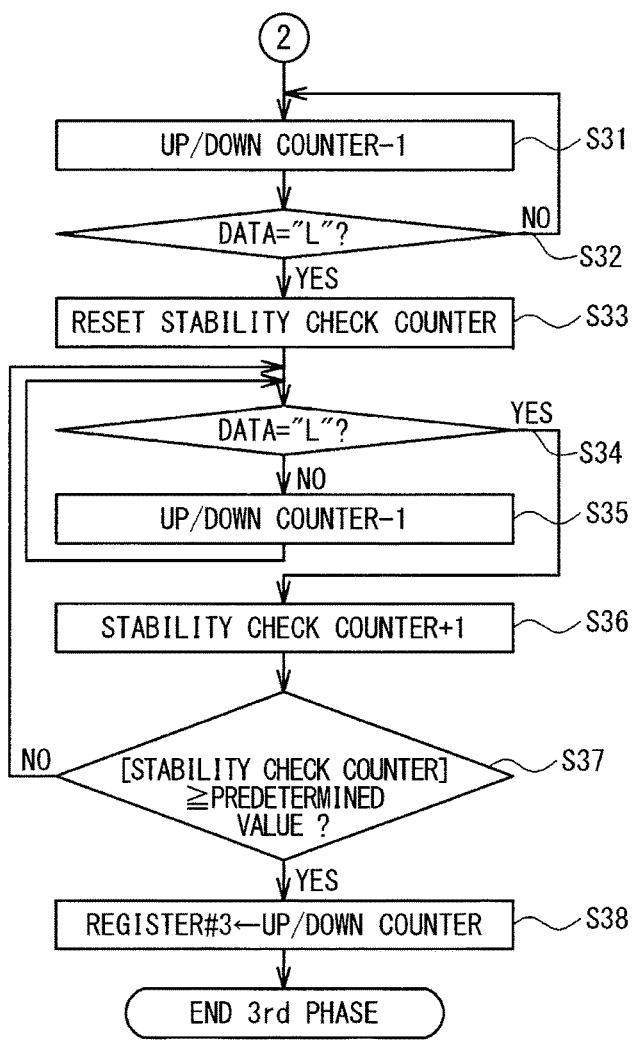

FIGS. 18A and 18B are flowcharts illustrating a preferred procedure of the third phase to suppress influences of time-dependent variations. As illustrated in FIG. 18A, when the third phase is initiated, the delay setting value D2 stored in register #2 is set to the up-down counter 23 as the count value (step S51). Additionally, the count value of the up-down counter 23 is selected by the selector 24 as the delay setting value to be set to the variable delay circuit 13a. As a result, the delay setting value D2 is set to the variable delay circuit 13a.

At steps S52 to S56, it is determined whether the value of the reception data 36 is stabilized to "H" by setting the delay setting value D2 to the variable delay circuit 13a.

More specifically, the stability check counter 22 is first reset (step S52) and it is determined whether the value of the reception data 36 is "H" (step S53).

When the value of the reception data 36 is not "H" at step S53, the count value of the up-down counter is increased by one (step S54), and it is determined again whether the value of the reception data 36 is "H" (step S53).

When the value of the reception data 36 is determined as "H" at step S53, the count value of the stability check counter 22 is increased by one (step S55).

Step S55 is followed by determining whether the count value of the stability check counter 22 reaches a predetermined reference value (step S56). When the count value of the stability check counter 22 does not reach the predetermined reference value, steps S53 to S55 are performed again. Steps S53 to S55 are repeated until the count value of the stability check counter 22 reaches the predetermined reference value.

The count value of the up-down counter 23 at the moment when the count value of the stability check counter 22 reaches the predetermined reference value is determined as suitable for the delay setting value D2. The count value of the up-down counter 23 at this moment is stored as a new delay setting value D2 into register #2.

As illustrated in FIG. 18B, the subsequent procedure is the same as steps S31 to S38 of the second phase illustrated in FIG. 13.

The above-described procedure, in which the delay setting value D2 is adjusted, effectively suppresses influences caused by time-dependent variations even after the optimum value of the delay setting value D2 has varied due to the time-dependent variations.

It should be noted that the clock inversion circuitry 14 may be omitted in the above-described embodiments. In this case, steps S11 and S12 are not performed in the first phase; when the value of the reception data 36 is "L" for the delay setting value being set to the initial value D0, the operation illustrated in FIG. 9A is performed. Although the time duration necessary for performing the first phase is made longer, the delay setting value D1 can be obtained also in this case.

Figure 19:
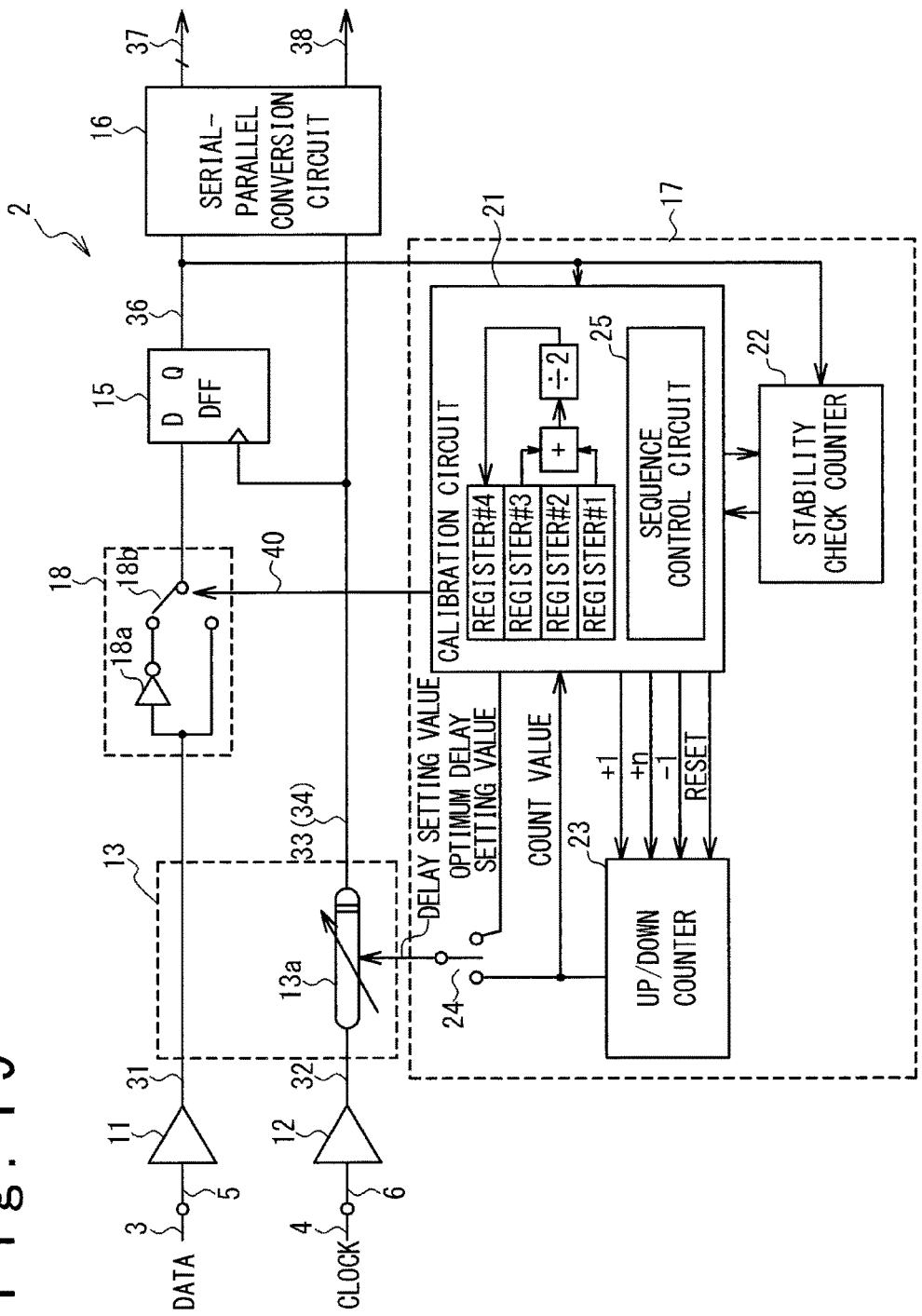
FIG. 19 is a block diagram illustrating another modified configuration of the data receiver.

Although the above-described embodiments recite that the clock inversion circuitry 14 is connected to the output of the variable delay circuit 13a, which is connected to the output of the receiver buffer 12 receiving the external clock signal 6, a data inversion circuitry 18 may be instead connected to the receiver buffer 11, which receives the external data signal 5, as illustrated in FIG. 19. The data inversion circuitry 18 selects one of the reception data signal 31 and an inverted data signal obtained by inverting the reception data signal 31, and supplies the selected data signal to the latch circuit 15. In this case, the delayed clock signal 33 output from the variable delay circuit 13a is used as the internal clock signal 34 without delay.

More specifically, the data inversion circuitry 18 includes an inverter 18a and a selector 18b. The inverter 18a generates an inverted data signal by inverting the reception data signal 31. The selector 18b selects one of the reception data signal 31 and the inverted data signal in response to a data polarity inversion signal 40 received from the delay control circuitry 17, and outputs the selected data signal to the latch circuit 15.

The operation of the data receiver 2 illustrated in FIG. 19 is almost similar to the data receiver 2 illustrated in FIG. 3. It should be noted however that the data polarity inversion signal 40 is activated to allow the selector 18b to select the inverted data signal, when the value of the reception data 36 is determined as "L" at step S11 in the first phase. The inverted data signal is thereafter supplied to the latch circuit 15. Other operations of the data receiver 2 illustrated in FIG. 19 are the same as those of the data receiver 2 illustrated in FIG. 3.

Figure 20:
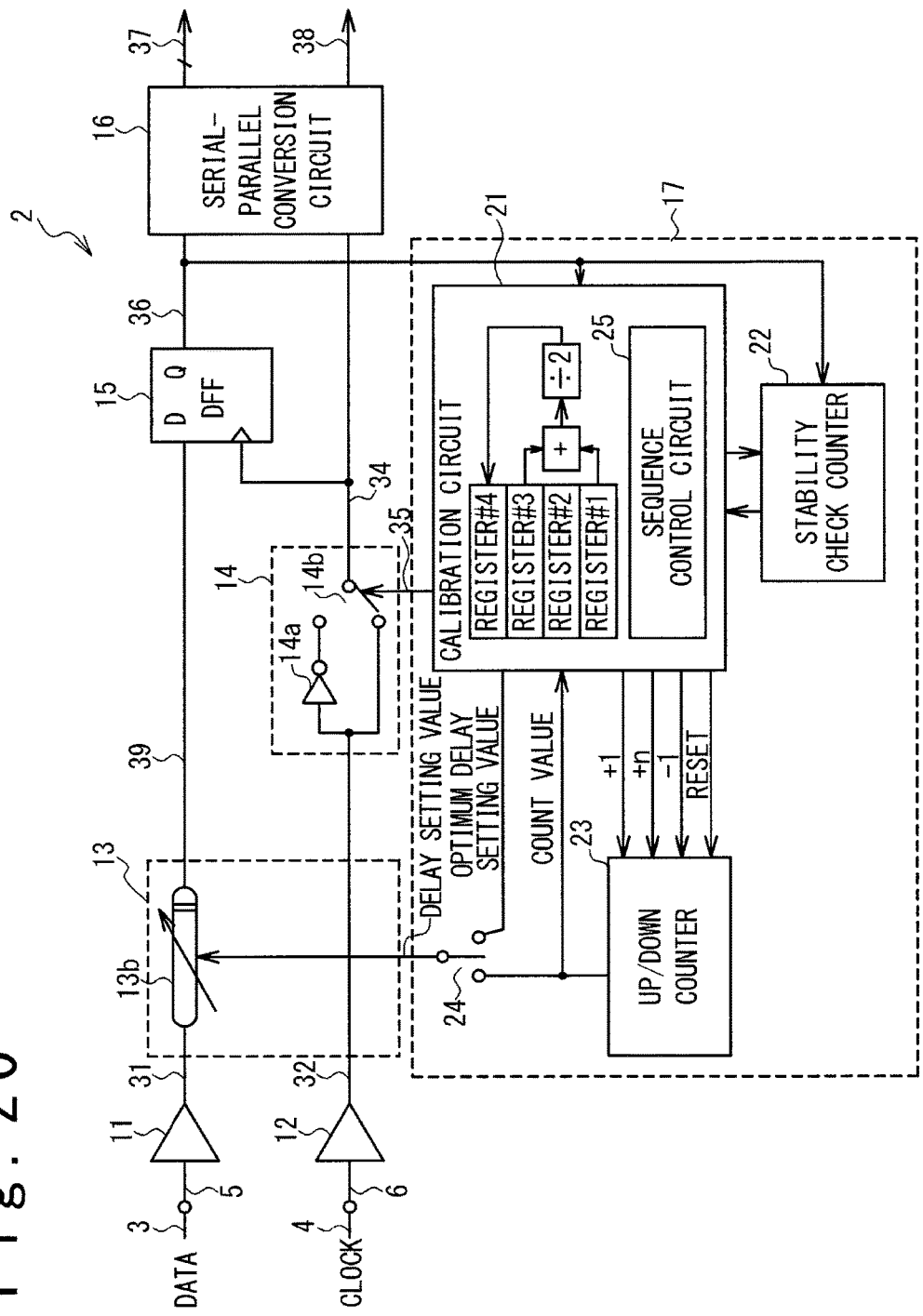
FIG. 20 is a block diagram illustrating still another modified configuration of the data receiver.

Although the above-described embodiments recite that the delay circuitry 13 includes the variable delay circuit 13a connected to the output of the receiver buffer 12 receiving the external clock signal 6, the data receiver 2 may instead include a variable delay circuit 13b connected to the output of the receiver buffer 11, which receives the external data signal 5, as illustrated in FIG. 20. In this case, the delay setting value output from the delay control circuitry 17 is supplied to the variable delay circuit 13b, and the set delay time of the variable delay circuit 13b is set in response to the delay setting value supplied from the delay control circuitry 17 to the variable delay circuit 13b. Also in this case, the above-described calibration process is performed to calculate the optimum delay setting value, and the optimum delay setting value is set to the variable delay circuit 13b.

Figure 21:
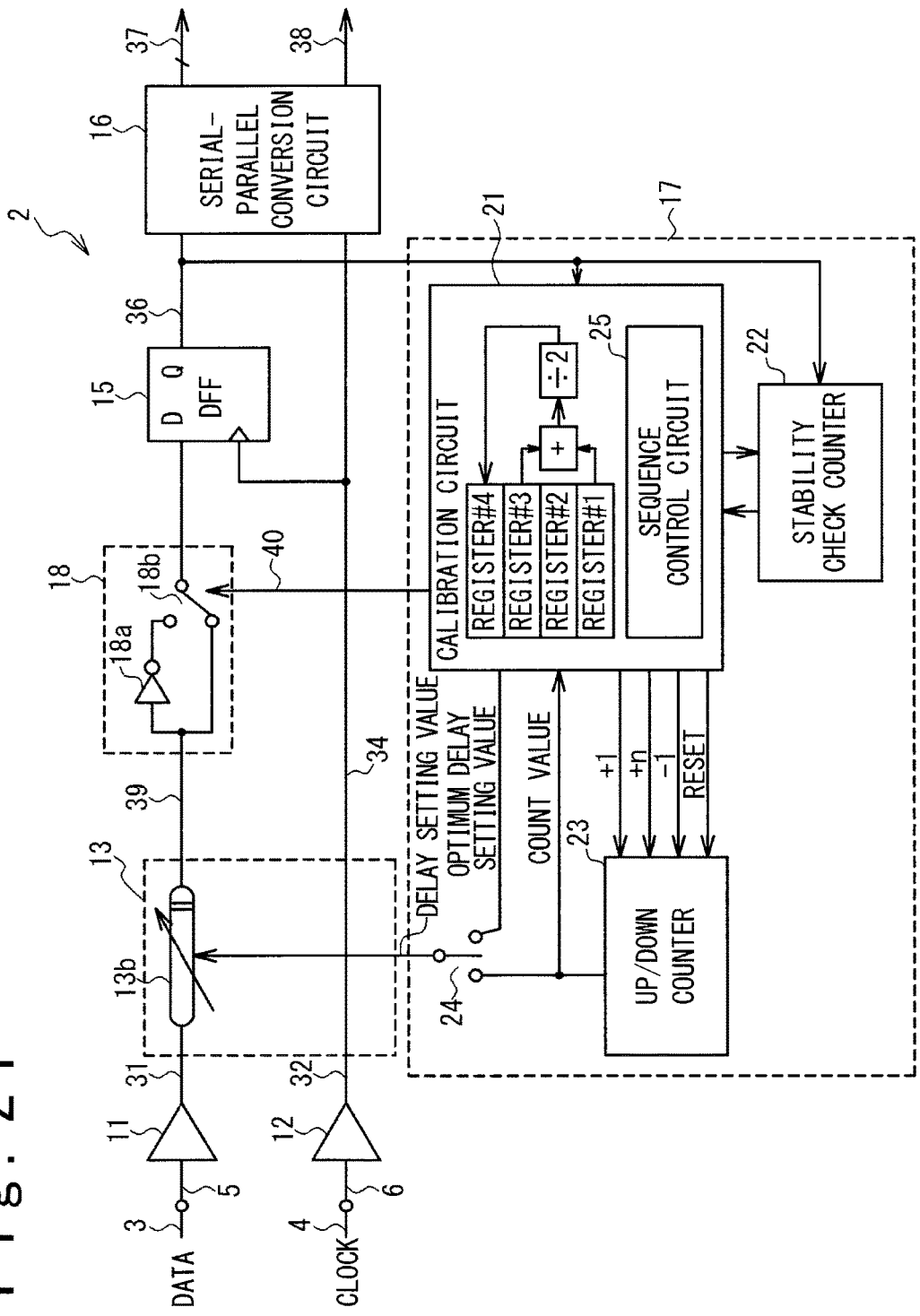
FIG. 21 is a block diagram illustrating still another modified configuration of the data receiver.

Also in this case, the data inversion circuitry 18 may be provided in place of the clock inversion circuitry 14. FIG. 21 is a block diagram illustrating the configuration of the data receiver 2 thus configured. In the configuration illustrated in FIG. 21, the data inversion circuitry 18 is connected to the output of the variable delay circuit 13b. The operation of the data receiver 2 illustrated in FIG. 21 is almost similar to that of the data receiver 2 illustrated in FIG. 20. When the value of the reception data 36 is determined as "L" at step S11 in the first phase, the data polarity inversion signal 40 is activated and the inverted data signal output from the inverter 18a is selected by the selector 18b. Thereafter, the inverted data signal is supplied to the latch circuit 15. Other operations of the data receiver 2 illustrated in FIG. 21 are the same as those of the data receiver 2 illustrated in FIG. 3.

Figure 22A:
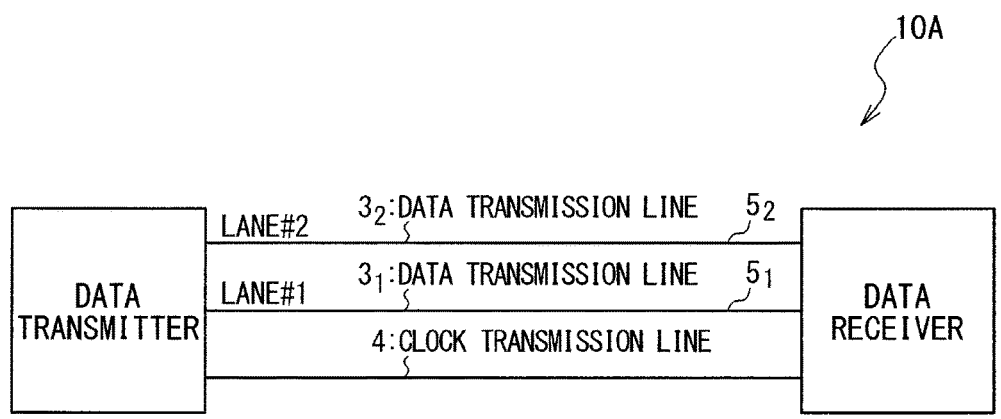
FIG. 22A is a block diagram illustrating a modified configuration of the data transfer system.

In one embodiment, the data transfer system may be configured to use a plurality of data transmission lines for data transfer. FIG. 22A illustrates an exemplary configuration of a data transfer system 10A which uses a plurality of data transmission lines for data transfer. The data transfer system 10A includes a data transmitter 1A and a data receiver 2A. The data transmitter 1A is connected to the data receiver 2A via two data transmission lines $3_1$, $3_2$ and a clock transmission line 4. The data transmission lines $3_1$ and $3_2$ are used as two data lines: lanes #1 and #2. Lane #1 (the data transmission line $3_1$) is used to transmit an external data signal $5_1$ and lane #2 (the data transmission line $3_2$) is used to transmit an external data signal $5_2$.

Figure 22B:
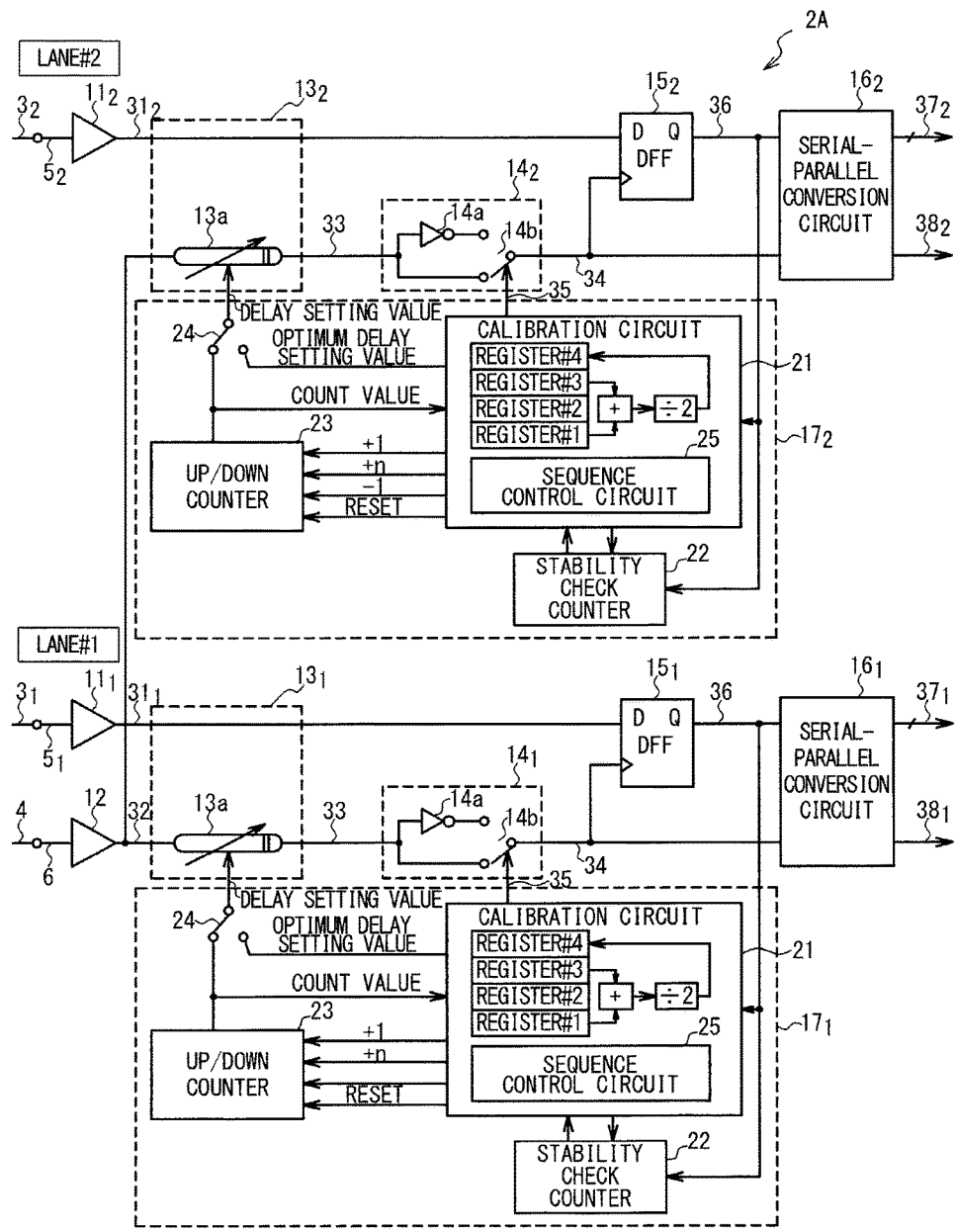
FIG. 22B is a block diagram illustrating an exemplary configuration of the data receiver used in the data transfer system illustrated in FIG. 22A.

FIG. 22B is a block diagram illustrating an exemplary configuration of the data receiver 2A. The data receiver 2A includes a receiver buffer 11, a delay circuitry 13, a clock inversion circuitry 14, a latch circuit 15, a serial-parallel conversion circuit 16 and a delay control circuitry 17 for each of lanes #1 and #2. In FIG. 18B, the numerals $11_1$, $13_1$, $14_1$, $15_1$, $16_1$ and $17_1$ denote the receiver buffer 11, the delay circuitry 13, the clock inversion circuitry 14, the latch circuit 15, the serial-parallel conversion circuit 16 and the delay control circuitry 17 which are associated with lane #1. Similarly, the numerals $11_2$, $13_2$, $14_2$, $15_2$, $16_2$ and $17_2$ denote the receiver buffer 11, the delay circuitry 13, the clock inversion circuitry 14, the latch circuit 15, the serial-parallel conversion circuit 16 and the delay control circuitry 17 which are associated with lane #2.

The receiver buffer 12, which receives the external clock signal 6, is shared by lanes #1 and #2. The reception clock signal 32 output from the receiver buffer 12 is supplied to the variable delay circuit 13a of the delay circuitry $13_1$ of lane #1 and the variable delay circuit 13a of the delay circuitry $13_2$ of lane #2. The delay control circuitry $17_1$ performs the calibration process with respect to the data transfer over lane #1 to calculate the optimum delay setting value to be set to the variable delay circuit 13a of the delay circuitry $13_1$. Similarly, the delay control circuitry $17_2$ performs the calibration process with respect to the data transfer over lane #2 to calculate the optimum delay setting value to be set to the variable delay circuit 13a of the delay circuitry $13_2$. The calibration operations performed by the delay control circuitries $17_1$ and $17_2$ are the same as the calibration operation performed in the above-described data transfer system 10.

Although the data transfer system 10A illustrated in FIGS. 22A and 22B are configured to transfer the external data signals $5_1$ and $5_2$ via two data transmission lines, the number of the data transmission lines is not limited to two. For example, the MIPI D-PHY specification allows provision of up to four data lanes (four data transmission lines). The configuration of the data receiver 2A may be modified in accordance with the number of data lanes.

In the operation in the above-described embodiment, the optimum delay setting value is calculated on the basis of delay setting values D1 and D3 each when the calibration operation is performed; however, such operation may be susceptible to a miscalculation of the optimum delay setting value. When at least one of the delay setting values D1 and D3 is improperly determined due to noise or the like, the optimum delay setting value may be also calculated as an improper value.

To avoid this problem, optional operation #1 described in the following may be performed after the third phase is completed. In optional operation #1, when an optimum delay setting value is newly calculated, the newly calculated optimum delay setting value is compared with the previously-calculated optimum delay setting value stored in register #4 and the optimum delay setting value stored in register #4 is increased or decreased by a predetermined value (for example, "1") in response to the result of the comparison. In other words, the average of the set delay time obtained through the searching in the first phase and that obtained through the searching in the third phase is compared with the optimum value of the set delay time determined in the previous calibration process and the optimum value of the set delay time is increased or decreased by a predetermined delay time in response to the comparison result. Optional operation #1 effectively limits undesired variations in the optimum delay setting value to the predetermined value at a maximum, even when the optimum delay setting value (that is the optimum value of the set delay time) is improperly calculated.

Figure 23:
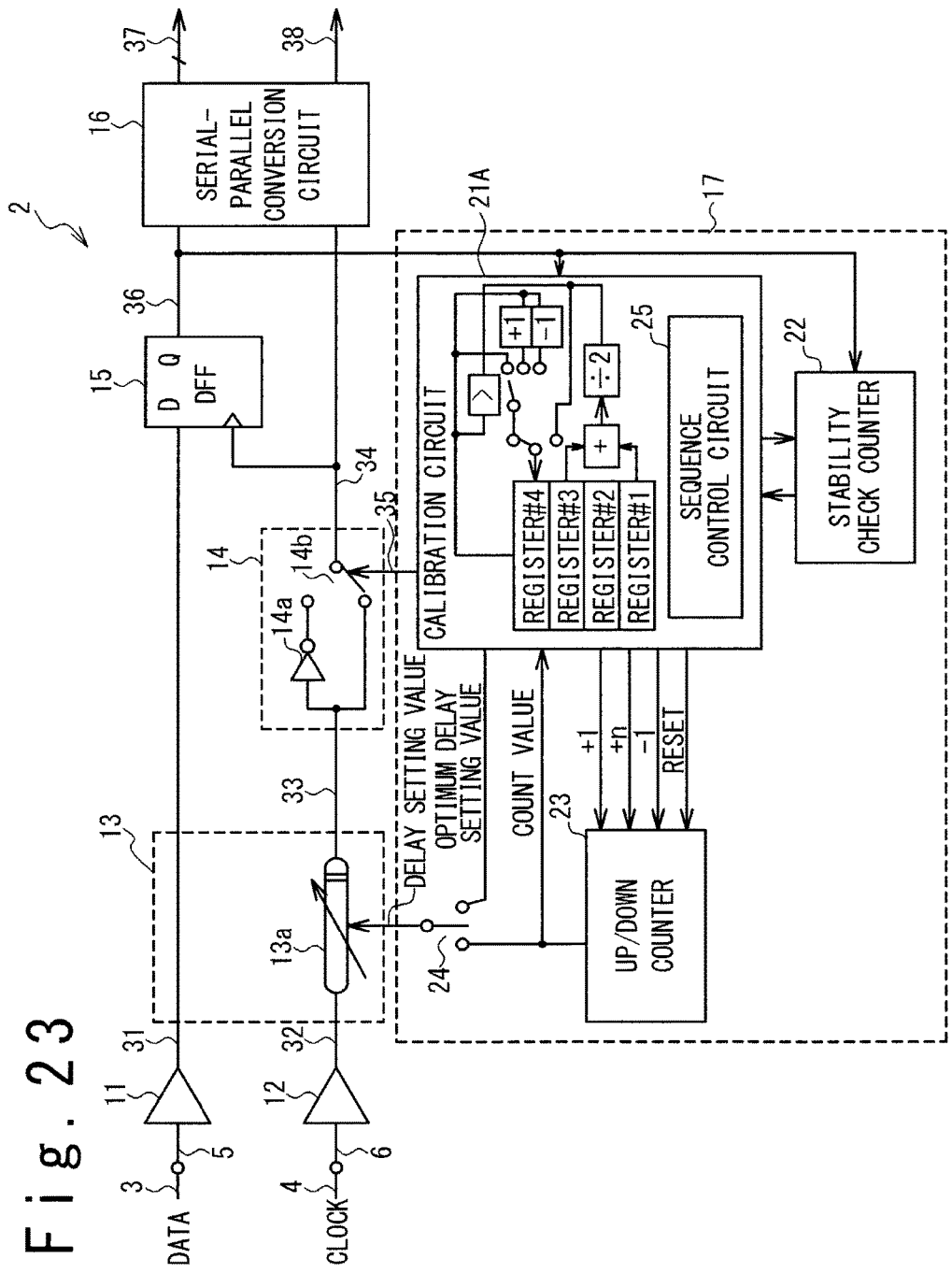
FIG. 23 is a block diagram illustrating an exemplary configuration of a data receiver adapted to optional operation #1.

FIG. 23 illustrates an exemplary configuration of a data receiver 2 adapted to optional operation #1. The calibration control circuit 21A of the data receiver 2 illustrated in FIG. 23 is configured to compare the optimum delay setting value newly calculated from delay setting values D1 and D3 stored in registers #1 and #3 with the previously-obtained optimum delay setting value stored in register #4 and increase or decrease the optimum delay setting value stored in register #4 by a predetermined value (for example, "1") in response to the comparison result.

Figure 24:
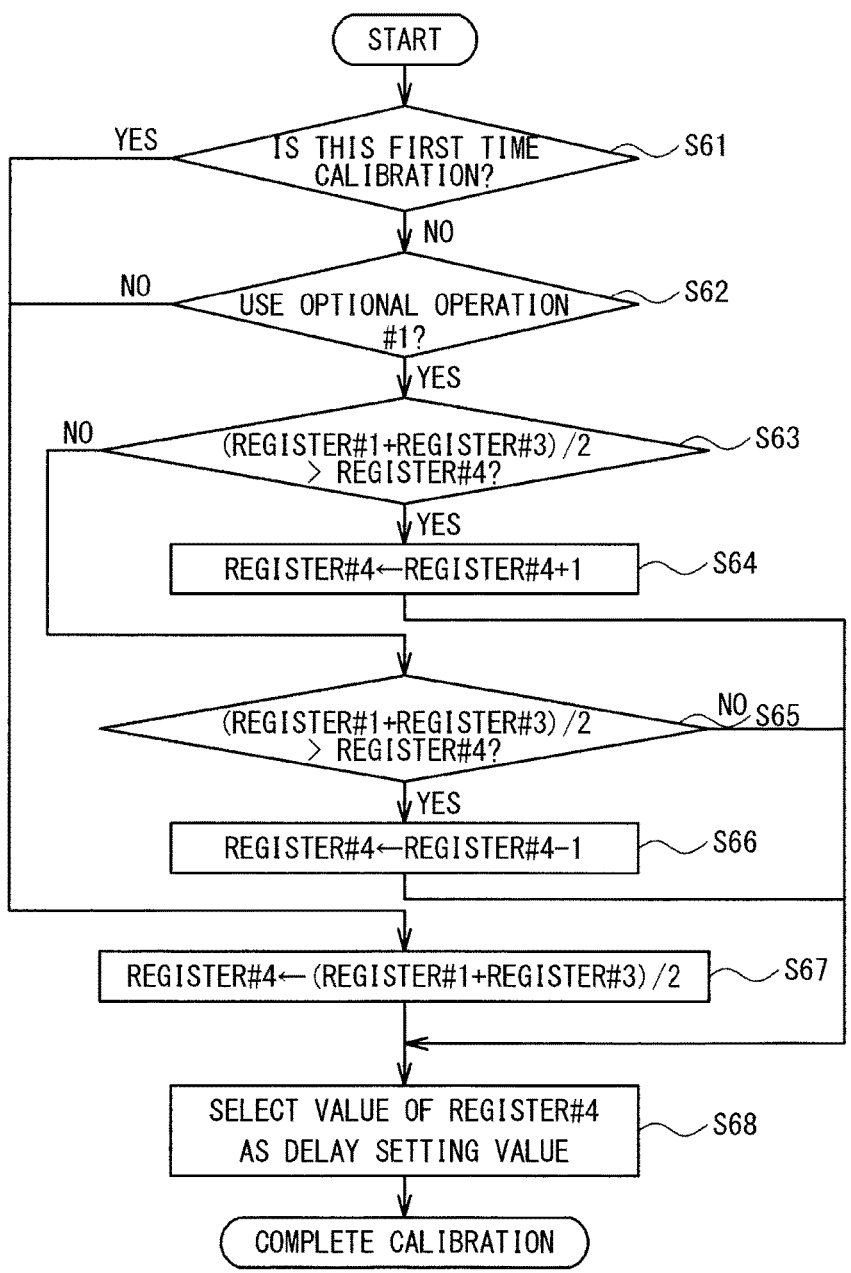
FIG. 24 is a flowchart illustrating an exemplary procedure of optional operation #1.

FIG. 24 is a flowchart illustrating an exemplary procedure of optional operation #1. Optional operation #1 is not performed in the first calibration process (step S61: YES). In the first calibration operation, the optimum delay setting value is calculated as the average value of the delay setting value D1 obtained through the searching in the first phase and the delay setting value D3 obtained through the searching in the third phase, as described above (step S67).

Also in the second and later calibration operation, when optional operation #1 is not performed (step S62: NO), the optimum delay setting value is calculated as the average value of the delay setting value D1 obtained through the searching in the first phase and the delay setting value D3 obtained through the searching in the third phase, as described above (step S67).

When optional operation #1 is performed in the second or later calibration process, the average of the delay setting values D1 and D3 obtained through the searching in the first and third phases is compared with the previously-obtained optimum delay setting value stored in register #4 (step S63).

When the average of the delay setting values D1 and D3 obtained through the searching in the first and third phases is larger than the previously-obtained optimum delay setting value stored in register #4 (step S63: YES), the optimum delay setting value stored in register #4 is increased by a predetermined value (for example, "1") (step S64). When the average of the delay setting values D1 and D3 obtained through the searching in the first and third phases is smaller than the previously-obtained optimum delay setting value stored in register #4 (step S65: YES), on the other hand, the optimum delay setting value stored in register #4 is decreased by a predetermined value (for example, "1") (step S66).

Stored in register #4 is the optimum delay setting value calculated and updated in this way. In the normal operation, the optimum delay setting value stored in register #4 is selected as the delay setting value to be set to the variable delay circuit 13a (step S68).

Updating the optimum delay setting value in the procedure of optional operation #1 effectively reduces influences of a miscalculation of the optimum delay setting value.

In the second and later calibration processes, it is possible to complete the calibration process in a short time by performing optional operation #2 which uses the result of the first calibration process (that is, the delay setting values D1 and D3 obtained in the first and third phases of the first calibration process) as described in the following.

Figure 25:
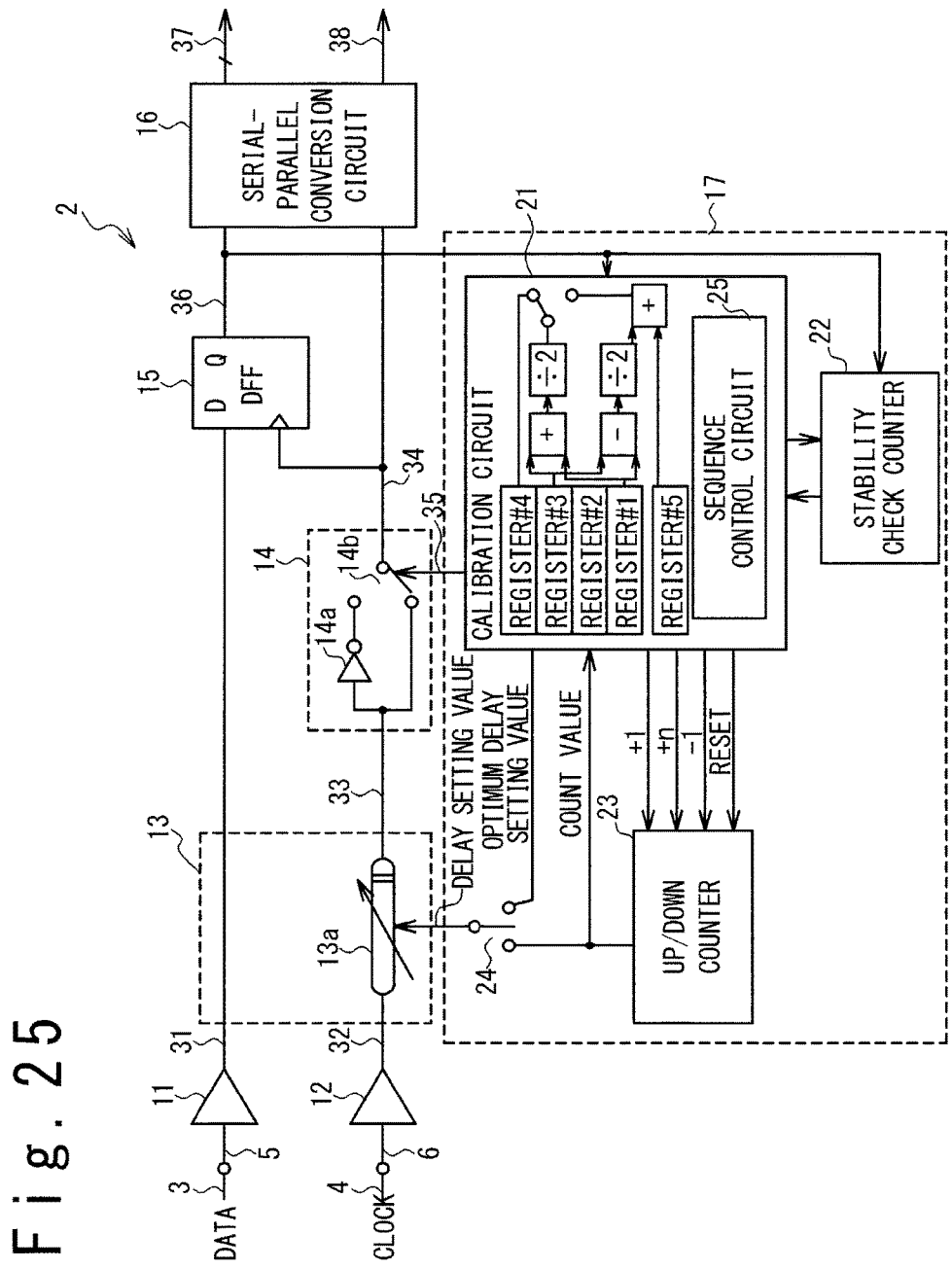
FIG. 25 is a block diagram illustrating an exemplary configuration of a data receiver adapted to optional operation #2.

FIG. 25 is a block diagram illustrating an exemplary configuration of the data receiver 2 adapted to optional operation #2. In the configuration illustrated in FIG. 25, the calibration control circuit 21 incorporates five registers #1 to #5. Registers #1 to #3 are used store the delay setting values D1 to D3 obtained in the first calibration process. Resister #4 is used to store the optimum delay setting value. Register #5 is used to store a delay setting value D4 obtained in the second and later calibration processes. In the second and later calibration processes, similarly to the first phase of the first calibration process, the minimum delay setting value is searched while the delay setting value set to the variable delay circuit 13a is increased from the initial value (typically, "0"), so that the value of the reception data 36 is stabilized to "L" with the searched delay setting value after the value of the reception data 36 is switched from "H" to "L". The delay setting value obtained by this searching is stored in register #5 as the delay setting value D4.

In the data receiver 2 adapted to optional operation #2, the calibration control circuit 21 is configured to calculate the optimum delay setting value in the second and later calibration processes on the basis of the delay setting value #4 obtained in the searching in the second and later calibration processes and the delay setting values D1 and D3 obtained in the first calibration process. More specifically, the calibration control circuit 21 is configured to calculate the optimum delay setting values as D4+(D3−D1)/2 in the second and later calibration processes.

Figure 26A:
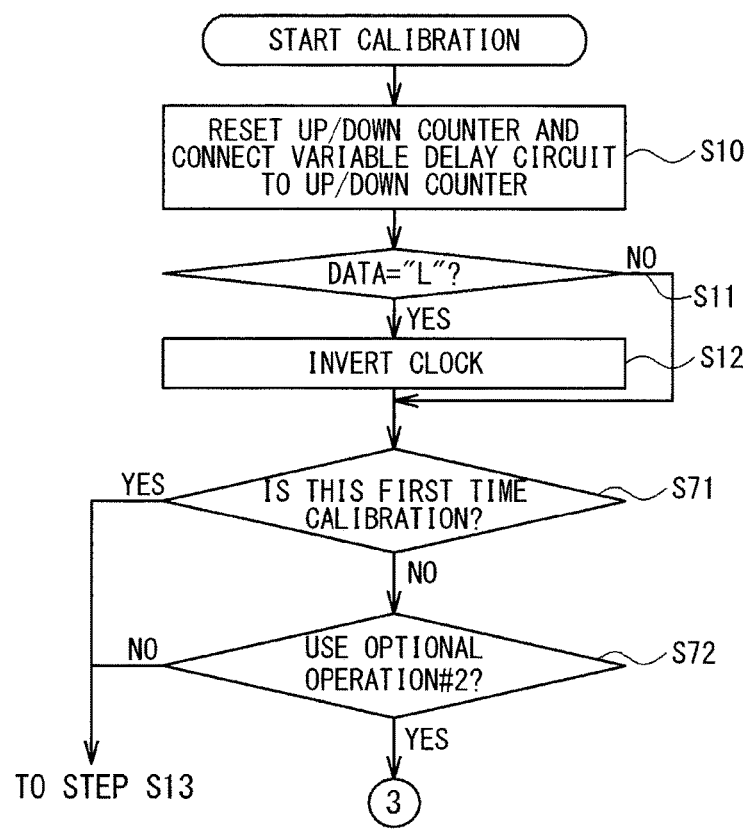
FIGS. 26A and 26B are flowcharts illustrating an exemplary procedure of optional operation #2.
Figure 26B:
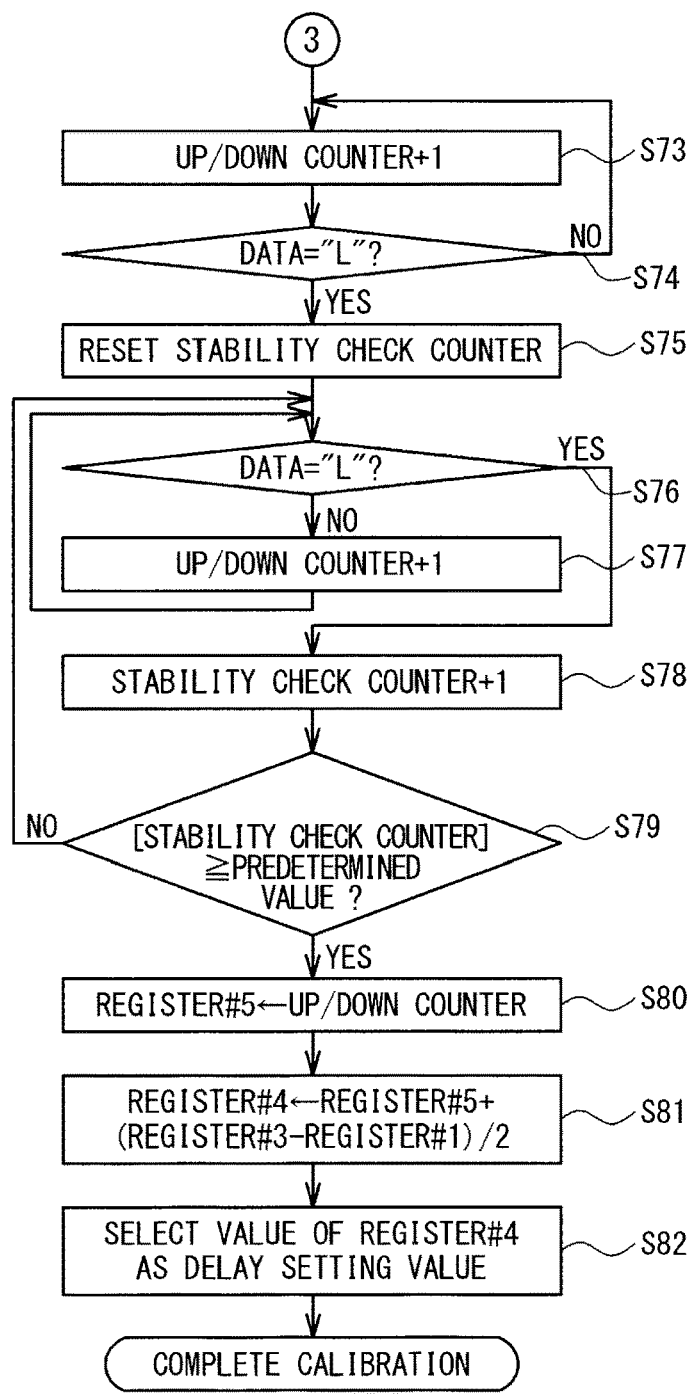

FIGS. 26A and 26B are flowcharts illustrating the calibration operation performed in the data receiver 2 adapted to optional operation #2.

As illustrated in FIG. 26, the above-described procedures of the first to third phases are performed in the first calibration process (step S71: YES). More specifically, the up-down counter 23 is first reset and the variable delay circuit 13a is connected to the up-down counter 23 (step S10). In detail, the reset signal is activated by the calibration control circuit 21 at step S10 to reset the count value of the up-down counter 23 to the initial value (typically, "0"). Additionally, the count value of the up-down counter 23 is selected by the selector 24 as the delay setting value to be set to the variable delay circuit 13a. This allows setting the initial value D0 to the variable delay circuit 13a as the delay setting value.

This is followed by determining the value of reception data 36 by the calibration control circuit 21 (step S11). When the value of the reception data 36 is determined as "L" at step S11, the clock polarity inversion signal 35 is activated to invert the internal clock signal 34 (step S12). That is, the inverted clock signal is selected by the selector 14b in response to the activation of the clock polarity inversion signal 35 and the inverted clock signal is thereafter used as the internal clock signal 34. This is followed by performing step S13 and the following steps in the first phase illustrated in FIG. 7 and the second and third phases illustrated in FIGS. 11 and 13 and then calculating the optimum delay setting value.

When optional operation #2 is not performed in the second and later calibration processes (step S71: NO, step S72: NO), the above-described first to third phases are similarly performed and the optimum delay setting value is calculated.

When optional operation #2 is performed in the second and later calibration processes, the optimum delay setting value is calculated in the procedure described in the following.

First, the above-described steps S10 to S12 are performed. This results in that the initial value D0 is set to the variable delay circuit 13a as the delay setting value and the internal clock signal 34 is inverted in accordance with the necessity.

This is followed by searching a set delay time of the variable delay circuit 13a while increasing the set delay time set to the variable delay circuit 13a, so that the value of the reception data 36 is stabilized to "L" with the searched set delay time after the value of the reception data 36 is switched from "H" to "L".

More specifically, as illustrated in FIG. 26B, the count value of the up-down counter 23, that is, the delay setting value set to the variable delay circuit 13a is increased with increments of one until the value of the reception data 36 becomes "L" after the value of the reception data 36 is switched from "H" to "L" (steps S73 and S74). Note that the increment with which the delay setting value is increased at step S73 and S74 is one.

When the value of the reception data 36 is determined as "L" for a certain delay setting value (that is, for a certain set delay time of the variable delay circuit 13a) at step S74, it is determined at steps S75 to S79 whether the value of the reception data 36 is stabilized to "L" with this delay setting value.

More specifically, the stability check counter 22 is first reset (step S75) and it is determined again whether the value of the reception data 36 is "L" in this state (step S76).

When the value of the reception data 36 is not determined as "L" at step S76, the count value of the up-down counter 23 is increased by one (step S77) and it is determined again whether the value of the reception data 36 is "L" (step S76).

When the value of the reception data 36 is determined as "L" at step S76, the count value of the stability check counter 22 is increased by one (step S78).

Step S78 is followed by determining whether the count value of the stability check counter 22 reaches a predetermined reference value (step S79). When the count value of the stability check counter 22 does not reach the predetermined reference value, steps S76 to S78 are performed again. Steps S76 to S78 are repeated until the count value of the stability check counter 22 reaches the predetermined reference value.

The count value of the up-down counter 23 at the moment when the count value of the stability check counter 22 reaches the predetermined reference value, that is, the delay setting value set to the variable delay circuit 13a at this moment is determined as the delay setting value D4. The delay setting value D4 is stored and held in register #5 of the calibration control circuit 21 (step S80).

The optimum delay setting value is calculated on the basis of the delay setting value D1 stored in register #1, the delay setting value D3 stored in register #3 and the delay setting value D4 stored in register #5 and the calculated optimum delay setting value is stored in register #4 (step S81). More specifically, the optimum delay setting value is calculated as D4+(D3−D1)/2. In other words, in optional operation #2, the optimum value of the set delay time is calculated as the delay time obtained by adding the half of the difference obtained by subtracting the set delay time obtained in the first phase of the first calibration process from the set delay time obtained in the third phase of the first calibration process to the set delay time of the variable delay circuit 13a obtained in the current (the second or later) calibration operation. In a subsequent normal operation, the optimum delay setting value stored in register #4 is used as the delay setting value to be set to the variable delay circuit 13a (step S82). This completes the calibration process.

Use of optional operation #2 advantageously reduces the time necessary for performing the second and later calibration processes.

Although various embodiments of the present disclosure have been specifically described, the present invention must not be construed as being limited to the above-described embodiments. A person skilled in the art would appreciate that the present invention may be implemented with various modifications.

What is claimed is:

1. A semiconductor device, comprising:
a first buffer configured to output a reception data signal corresponding to a received external data signal;
a second buffer configured to output a reception clock signal corresponding to a received external clock signal;
a latch circuit configured to latch, responsive to the reception clock signal, the reception data signal or a signal generated from the reception data signal to output reception data corresponding to the reception data signal;
a delay circuitry configured to delay, by a set delay time, one of the reception data signal and the reception clock signal with respect to the other of the reception data signal and the reception clock signal; and
a delay control circuitry configured to, in a first calibration process:
responsive to increasing the set delay time from an initial value, determine a first delay time as a value of the set delay time at which a value of the reception data is stabilized to a first value;
responsive to increasing the set delay time from the first delay time, determine a second delay time as a value of the set delay time at which the value of the reception data is stabilized to a second value different than the first value;
responsive to decreasing the set delay time from the second delay time, determine a third delay time as a value of the set delay time at which the value of the reception data is stabilized to the first value;
compare an average of the first delay time and the third delay time with a previous optimum value; and
determine an optimum value of the set delay time as one of:
when the average is longer than the previous optimum value, a delay time that is longer than the previous optimum value by a predetermined time duration; and
when the average is shorter than the previous optimum value, a delay time that is shorter than the previous optimum value by a predetermined time duration.

2. The semiconductor device, according to claim 1, wherein the delay control circuitry is further configured to increase the set delay time from the initial value with first increments, and to increase the set delay time from the first delay time with second increments larger than the first increments.

3. A semiconductor device comprising:
a first buffer configured to output a reception data signal corresponding to a received external data signal;
a second buffer configured to output a reception clock signal corresponding to a received external clock signal;
an inverter configured to generate an inverted clock signal by inverting the reception clock signal;
a selector circuit configured to supply an internal clock signal selected from the reception clock signal and the inverted clock signal;

a latch circuit configured to latch the reception data signal in response to the internal clock signal, wherein the latch circuit outputs reception data corresponding to the reception data signal;
a delay circuitry configured to delay, by a set delay time, one of the reception data signal and the reception clock signal with respect to the other of the reception data signal and the reception clock signal; and
a delay control circuitry configured to:
responsive to increasing the set delay time from an initial value, determine a first delay time as a value of the set delay time at which a value of the reception data is stabilized to a first value;
responsive to increasing the set delay time from the first delay time, determine a second delay time as a value of the set delay time at which the value of the reception data is stabilized to a second value different than the first value;
responsive to decreasing the set delay time from the second delay time, determine a third delay time as a value of the set delay time at which the value of the reception data is stabilized to the first value; and
determine an optimum value of the set delay time based on the first delay time and the third delay time,
wherein the selector circuit is further configured to, when the latch circuit latches the first value while the set delay time is the initial value, select the inverted clock signal for determining the first delay time, the second delay time, and the third delay time.

4. A semiconductor device comprising:
a first buffer configured to output a reception data signal corresponding to a received external data signal;
a second buffer configured to output a reception clock signal corresponding to a received external clock signal;
an inverter configured to generate an inverted data signal by inverting the reception data signal; and
a selector circuit configured to supply a selected data signal selected from the reception data signal and the inverted data signal;
a latch circuit configured to latch the selected data signal, wherein the latch circuit outputs reception data corresponding to the selected data signal;
a delay circuitry configured to delay, by a set delay time, one of the reception data signal and the reception clock signal with respect to the other of the reception data signal and the reception clock signal; and
a delay control circuitry configured to:
responsive to increasing the set delay time from an initial value, determine a first delay time as a value of the set delay time at which a value of the reception data is stabilized to a first value;
responsive to increasing the set delay time from the first delay time, determine a second delay time as a value of the set delay time at which the value of the reception data is stabilized to a second value different than the first value;
responsive to decreasing the set delay time from the second delay time, determine a third delay time as a value of the set delay time at which the value of the reception data is stabilized to the first value; and
determine an optimum value of the set delay time based on the first delay time and the third delay time,
wherein the selector circuit is further configured to, when the latch circuit latches the first value while the set delay time is the initial value, select the inverted data signal for determining the first delay time, the second delay time, and the third delay time.

5. The semiconductor device according to claim 1, wherein the previous optimum value of the set delay time is determined in a previous calibration process.

6. The semiconductor device according to claim 1, wherein the delay control circuitry is further configured to, in a second calibration process performed after the first calibration process:
set the set delay time to the initial value;
responsive to increasing the set delay time from the initial value, determine a fourth delay time as a value of the set delay time at which the value of the reception data is stabilized to the first value; and
determine the optimum value of the set delay time by adding, to the fourth delay time, a half of a difference obtained by subtracting the first delay time from the third delay time.

7. The semiconductor device according to claim 1, wherein the external data signal and the external clock signal are received in a period between determining the first delay time and determining the second delay time, and
wherein the delay control circuitry is further configured to:
determine, while determining the second delay time, whether the value of the reception data is stabilized to the first value when the first delay time is set as the set delay time, and
adjust the first delay time when the value of the reception data is not stabilized to the first value when the first delay time is set as the set delay time.

8. The semiconductor device according to claim 1, wherein the external data signal and the external clock signal are received in a period between determining the second delay time and determining the third delay time, and
wherein the delay control circuitry is further configured to:
determine, while determining the third delay time, whether the value of the reception data is stabilized to the second value when the second delay time is set as the set delay time, and
adjust the second delay time when the value of the reception data is not stabilized to the second value when the second delay time is set as the set delay time.

9. A data transfer system, comprising:
a data transmitter configured to output an external data signal and an external clock signal; and
a data receiver configured to:
receive the external data signal via a data transmission line; and
receive the external clock signal via a separate clock transmission line,
wherein the data receiver includes:
a first buffer configured to output a reception data signal corresponding to the external data signal;
a second buffer configured to output a reception clock signal corresponding to the external clock signal;
a latch circuit configured to latch, responsive to the reception clock signal, the reception data signal or a signal generated from the reception data signal to output reception data corresponding to the reception data signal;
a delay circuitry configured to delay, by a set delay time, one of the reception data signal and the reception clock signal with respect to the other of the reception data signal and the reception clock signal; and a delay control circuitry configured to:
responsive to increasing the set delay time from an initial value, determine a first delay time as a value of the set delay time at which the value of the reception data is stabilized to a first value;
responsive to increasing the set delay time from the first delay time, determine a second delay time as a value of the set delay time at which the value of the reception data is stabilized to a second value different than the first value;
responsive to decreasing the set delay time from the second delay time, determine a third delay time as a value of the set delay value at which the value of the reception data is stabilized to the first value;
compare an average of the first delay time and the third delay time with a previous optimum value; and
determine an optimum value of the set delay time as one of:
when the average is longer than the previous optimum value, a delay time that is longer than the previous optimum value by a predetermined time duration; and
when the average is shorter than the previous optimum value, a delay time that is shorter than the previous optimum value by a predetermined time duration.

10. The data transfer system according to claim 9, wherein data transfer is performed in a period between determining the first delay time and determining the second delay time by transmitting the external data signal and the external clock signal from the data transmitter to the data receiver.

11. The data transfer system according to claim 10, wherein the delay control circuitry is further configured to:
determine, while determining the second delay time, whether the value of the reception data is stabilized to the first value when the first delay time is set as the set delay time, and
adjust the first delay time when the value of the reception data is not stabilized to the first value when the first delay time is set as the set delay time.

12. The data transfer system according to claim 9, wherein data transfer is performed in a period between determining the second delay time and determining the third delay time by transmitting the external data signal and the external clock signal from the data transmitter to the data receiver.

13. The data transfer system according to claim 12, wherein the delay control circuitry is further configured to:
determine, while determining the third delay time, whether the value of the reception data is stabilized to the second value when the second delay time is set as the set delay time, and
adjust the second delay time when the value of the reception data is not stabilized to the second value when the second delay time is set as the set delay time.

14. A method of operating a semiconductor device, the semiconductor device comprising: a first buffer configured to output a reception data signal corresponding to a received external data signal; a second buffer configured to output a reception clock signal corresponding to a received external clock signal; a latch circuit configured to latch, responsive to the reception clock signal, the reception data signal or a signal generated from the reception data signal to output reception data corresponding to the reception data signal; and a delay circuitry configured to delay, by a set delay time, one of the reception data signal and the reception clock signal with respect to the other of the reception data signal and the reception clock signal, the method comprising:

performing a calibration process to determine an optimum value of the set delay time, wherein the calibration process includes:
responsive to increasing the set delay time from an initial value, determining a first delay time as a value of the set delay time at which a value of the reception data is stabilized to a first value;
responsive to increasing the set delay time from the first delay time, determining a second delay time as a value of the set delay time at which the value of the reception data is stabilized to a second value different than the first value;
responsive to decreasing the set delay time from the second delay time, determining a third delay time as a value of the set delay value at which the value of the reception data is stabilized to the first value;
comparing an average of the first delay time and the third delay time with a previous optimum value; and
determining an optimum value of the set delay time as one of:
when the average is longer than the previous optimum value, a delay time that is longer than the previous optimum value by a predetermined time duration; and
when the average is shorter than the previous optimum value, a delay time that is shorter than the previous optimum value by a predetermined time duration.

15. The method according to claim 14, further comprising:
receiving the external data signal and the external clock signal in a period between determining the first delay time and determining the second delay time.

16. The method according to claim 15, further comprising:
determining, while determining the second delay time, whether the value of the reception data is stabilized to the first value when the first delay time is set as the set delay time, and
adjusting the first delay time when the value of the reception data is not stabilized to the first value when the first delay time is set as the set delay time.

17. The method according to claim 14, further comprising:
receiving the external data signal and the external clock signal in a period between determining the second delay time and determining the third delay time.

18. The method according to claim 17, further comprising:
determining, while determining the third delay time, whether the value of the reception data is stabilized to the second value when the second delay time is set as the set delay time, and
adjusting the second delay time when the value of the reception data is not stabilized to the second value when the second delay time is set as the set delay time.

19. A data transfer system, comprising:
a data transmitter configured to output an external data signal and an external clock signal; and
a data receiver configured to:
receive the external data signal via a data transmission line; and receive the external clock signal via a separate clock transmission line, wherein the data receiver includes:

a first buffer configured to output a reception data signal corresponding to an external data signal;

a second buffer configured to output a reception clock signal corresponding to the external clock signal;

an inverter configured to generate one of the following: (i) an inverted data signal corresponding to the reception data signal, and (ii) an inverted clock signal corresponding to the reception clock signal;

a latch circuit configured to latch one of the reception data signal and the inverted data signal in response to one of the reception clock signal and the inverted clock signal, wherein the latch circuit outputs reception data corresponding to the reception data signal;

a delay control circuitry configured to:

responsive to increasing a set delay time from an initial value, determine a first delay time as a value of the set delay time at which a value of the reception data is stabilized to a first value;

responsive to increasing the set delay time from the first delay time, determine a second delay time as a value of the set delay time at which the value of the reception data is stabilized to a second value different than the first value;

responsive to decreasing the set delay time from the second delay time, determine a third delay time as a value of the set delay time at which the value of the reception data is stabilized to the first value; and determine an optimum value of the set delay time based on the first delay time and the third delay time, and a delay circuitry configured to delay, by the optimum value, one of (i) the reception data signal and (ii) the reception clock signal with respect to the other of (i) and (ii), wherein, when the latch circuit latches the first value while the set delay time, is the initial value, the latch circuit uses one of the inverted data signal and the inverted clock signal for determining the first delay time, determining the second delay time, and determining the third delay time.

20. A method comprising:

outputting a reception data signal from a first buffer;

outputting a reception clock signal from a second buffer;

inverting one of the reception data signal and the reception clock signal;

latching, using a latch circuit, one of the reception data signal and the inverted reception data signal responsive to one of the reception clock signal and the inverted reception clock signal, wherein the latch circuit outputs reception data corresponding to the reception data signal;

responsive to increasing a set delay time from an initial value, determining a first delay time as a value of the set delay time at which a value of the reception data is stabilized to a first value;

responsive to increasing the set delay time from the first delay time, determine a second delay time as a value of the set delay time at which the value of the reception data is stabilized to a second value different than the first value;

responsive to decreasing the set delay time from the second delay time, determine a third delay time as a value of the set delay time at which the value of the reception data is stabilized to the first value;

determining an optimum value of the set delay time based on the first delay time and the third delay time; and delaying, by the optimum value, one of (i) the reception data signal and (ii) the reception clock signal with respect to the other of (i) and (ii), wherein, when the latch circuit latches the first value while the set delay time is the initial value, the latch circuit uses one of the inverted reception data signal and the inverted reception clock signal for determining the first delay time, determining the second delay time, and determining the third delay time.

\* \* \* \* \*